(12) United States Patent
Smaldone et al.

(10) Patent No.: US 9,189,402 B1
(45) Date of Patent: Nov. 17, 2015

(54) METHOD FOR PACKING AND STORING CACHED DATA IN DEDUPLICATED CACHE SYSTEM OF A STORAGE SYSTEM

(71) Applicant: EMC Corporation, Hopkinton, MA (US)

(72) Inventors: Stephen Smaldone, Monroe Township, NJ (US); Grant R. Wallace, Pennington, NJ (US); Frederick Douglis, Basking Ridge, NJ (US); Philip N. Shilane, Yardley, PA (US); Hyong Shim, Basking Ridge, NJ (US)

(73) Assignee: EMC Corporation, Hopkinton, MA (US)

( * ) Notice: Subject to any disclaimer, the term of this patent is extended or adjusted under 35 U.S.C. 154(b) by 30 days.

(21) Appl. No.: 14/038,699

(22) Filed: Sep. 26, 2013

(51) Int. Cl.
G06F 12/08 (2006.01)
G06F 12/12 (2006.01)
G11C 7/10 (2006.01)

(52) U.S. Cl.
CPC .......... G06F 12/0808 (2013.01); G06F 12/121 (2013.01); G11C 7/1072 (2013.01)

(58) Field of Classification Search
CPC .................................................. G06F 12/0802
See application file for complete search history.

(56) References Cited

U.S. PATENT DOCUMENTS

| | | | |
|---|---|---|---|
| 7,747,584 B1 | 6/2010 | Jernigan | |
| 8,131,924 B1 | 3/2012 | Frandzel et al. | |
| 8,275,935 B2 | 9/2012 | Suzuki | |
| 8,782,348 B2 * | 7/2014 | Eddy et al. | 711/146 |
| 2008/0005141 A1 | 1/2008 | Zheng et al. | |
| 2011/0119442 A1 * | 5/2011 | Haines et al. | 711/113 |
| 2011/0307683 A1 * | 12/2011 | Spackman | 711/216 |
| 2013/0151802 A1 | 6/2013 | Bahadure et al. | |
| 2013/0262805 A1 | 10/2013 | Zheng et al. | |

OTHER PUBLICATIONS

Chen, Feng, et al., "CAFTL: A Content-Aware Flash Translation Layer Enhancing the Lifespan of Flash Memory based Solid State Drives", 2011, 14 pages.
Feng, Jingxin, et al., "A Deduplication Study for Host-side Caches in Virtualized Data Center Environments", 2013, 6 pages, IEEE.
Huang, Wen-Tzeng, et al., "A Compression Layer for NAND Type Flash Memory Systems", 2005, 6 pages, IEEE.
Kim, Jonghwa, et al., "Deduplication in SSDs: Model and Quantitative Analysis", 2013, 12 pages, IEEE.

(Continued)

*Primary Examiner* — Henry Tsai
*Assistant Examiner* — Juanito Borromeo
(74) *Attorney, Agent, or Firm* — Blakely, Sokoloff, Taylor & Zafman LLP

(57) ABSTRACT

A computer-implemented method for caching content in a cache memory device is disclosed. The method starts with receiving, at a cache manager, one or more data chunks to be cached in a cache memory device, where the one or more data chunks are retrieved from a persistent storage disk of a storage system in response to a read request of a region of a file. Then the one or more data chunks of a file extent is compressed using a predetermined compression algorithm, and the file extent is packed into a write-evict unit (WEU) maintained in a random-access memory (RAM) that has been open to store a plurality of file extents. In response to determining that the WEU is full, the cache manager writes the WEU from the RAM into the cache memory device.

26 Claims, 31 Drawing Sheets

(56) References Cited

OTHER PUBLICATIONS

Makatos, Thanos, et al., "Using Transparent Compression to Improve SSD-based I/O Caches", Apr. 13-16, 2010, 14 pages, ACM, Paris, France.

Mao, Bo, et al., "SAR: SSD Assisted Restore Optimization for Deduplication-based Storage Systems in the Cloud", 2012, 10 pages.

Saxena, Mohit, et al., "FlashTier: a Lightweight, Consistent and Durable Storage Cache", Apr. 10-13, 2012, 14 pages, ACM, Bern, Switzerland.

Yim, Keun S., et al., "A Flash Compression Layer for SmartMedia Card Systems", vol. 50, No. 1, Feb. 2004, 6 pp., IEEE Transactions on Consumer Electronics.

Non-Final Office Action, U.S. Appl. No. 14/038,687, dated Dec. 8, 2014, 8 pages.

Non-Final Office Action, U.S. Appl. No. 14/038,665, dated Nov. 4, 2014, 10 pages.

Notice of Allowance, U.S. Appl. No. 14/038,668, dated Nov. 14, 2014, 9 pages.

Non-Final Office Action, U.S. Appl. No. 14/038,665, dated Mar. 9, 2015, 10 pages.

Non-Final Office Action, U.S. Appl. No. 14/038,694, dated Jul. 1, 2015, 15 pages.

Final Office Action, U.S. Appl. No. 14/038,687, dated May 19, 2015, 12 pages.

\* cited by examiner

| <File Handle, Offset> (16 Bytes) 802 | Cache WEU Locator (4 Bytes) 804 | WEU Offset (4 Bytes) 806 | Compressed Extent Size (4 Bytes) 808 |

File Index Base Entry Format

FIG. 8A

| <File Handle, Offset> (16 Bytes) 812 | Cache WEU Locator (4 Bytes) 814 | WEU Offset (4 Bytes) 816 | Compressed Extent Size (4 Bytes) 816 | Generation ID (2 Bytes) 818 |

File Index Duplicate Entry Format

FIG. 8B

| Fingerprint (20 Bytes) 822 | Cache WEU Locator (4 Bytes) 824 | WEU Offset (4 Bytes) 826 | Compressed Extent Size (4 Bytes) 828 |

Fingerprint Index Entry Format

FIG. 8C

METHOD FOR PACKING AND STORING CACHED DATA IN DEDUPLICATED CACHE SYSTEM OF A STORAGE SYSTEM

This application is related to co-pending U.S. patent application Ser. Nos. 14/038,665; 14/038,668; 14/038,673; 14/038,687; 14/038,694, all filed Sep. 26, 2013.

FIELD OF THE INVENTION

Embodiments of the present invention relate generally to data storage systems. More particularly, embodiments of the invention relate to a deduplicated and compressed storage device.

BACKGROUND

Traditional storage architecture separates primary storage from protection storage. Storage administrators have struggled with the complexity, cost, and overhead associated with the approach. Protection integrated primary (PIP) storage architecture is a new approach enabling consolidation of primary workloads and data protection into one physical storage system. PIP reduces storage costs and reduces the time for backup creation and restoration because of its integrated design.

In order to build a suitable PIP storage, one needs to balance price, performance, and capacity. A single PIP storage may utilize any type of non-volatile storage medium such as flash memory, PCIe-connected flash memory, solid state device (SSD), magnetic tape, and magneto-optical (MO) storage media to take advantage of different cost performance characteristics of different non-volatile storage medium. For example, SSDs can deliver about 500× more input/output operations per second (IOPS) than spinning disk but also have 5× the cost. SSDs, as well as other forms of flash memory, have a limited number of write-erase cycles after which a given region of memory cannot be rewritten. A tiered infrastructure, including a smaller cache/tier layer of a higher cost and higher performance medium such as SSD and a larger lower cost and lower performance medium such as disk storage, offers a good comprise. The challenge is to build the tiered infrastructure economically and with high performance.

BRIEF DESCRIPTION OF THE DRAWINGS

Embodiments of the invention are illustrated by way of example and not limitation in the figures of the accompanying drawings in which like references indicate similar elements.

FIGS. 8A-C illustrate formats of file index base entry, duplicate entry, and fingerprint index entry according to one embodiment of the invention.

DETAILED DESCRIPTION

Figure 1:
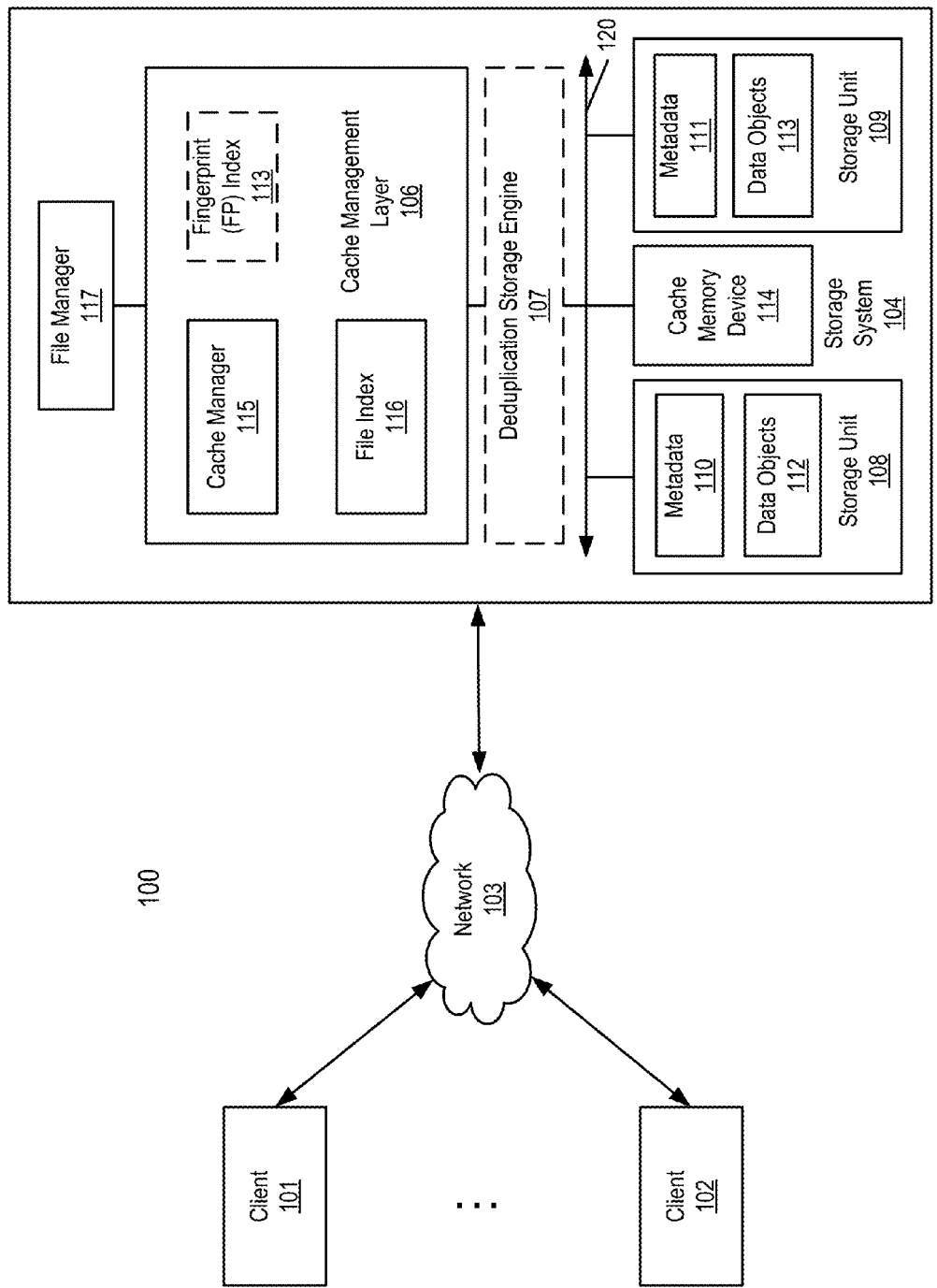
FIG. 1 is a block diagram illustrating a storage system according to one embodiment of the invention.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

According to some embodiments, techniques of a combination of deduplication and compression are utilized to effectively increase cache capacity. According to one aspect of the invention, a deduplicated cache system is provided to deduplicate and compress data to be cached in a cache memory device such as a non-volatile memory device. The cache system maintains a fingerprint index and a file index having file extent entries, where a file extent refers to a contiguous region of a file. The file index is used to access the cached file extents stored in the cache memory device. The fingerprint index is used to determine whether a particular file extent has already been cached in the cache memory device based on its respective fingerprint, which, in one embodiment, is a cryptographically secure hash over the data such as SHA1. In response to receiving a request to cache a file extent of a file, its fingerprint is generated or retrieved and used to look up in the fingerprint index to determine whether any fingerprint entry matching the fingerprint is found. If so, that means the content for the corresponding file extent has already been stored in the cache memory device. The file is associated with the storage location that caches the corresponding file extent by creating or inserting a file extent entry into the file index. While we use file system terminology throughout this document, the same techniques can be applied to storage volumes, object stores, and other storage devices.

According to another aspect of the invention, the fingerprint index is a partial index that only covers a subset of the file extents stored in the cache memory device. An efficient insertion and eviction mechanism is employed to maintain the fingerprint index in a relatively small size. A variety of replacement policies can be utilized to determine which of the file extent entries and associated fingerprint entries should be inserted or evicted from the file index and fingerprint index respectively. In addition, other replacement policies are utilized to determine which file extents should be inserted or evicted from the cache system. In one embodiment, each of the file entries may be associated with a list of one or more linked nodes that collectively represent a file extent, where each node includes a bitmap having multiple bits, each corresponding to one of the data blocks within the corresponding extent associated with the node. In some embodiments, the data block is an aligned sub-region of the file extent. As an illustrative example, using 32 KB file extents, a data block may be 4 KB. In other embodiments, the data block is a variable-sized sub-region of the file extent, in which case the extent header indicates the offset and size of each block within the extent. The bitmap indicates which of the data block within the file extent are valid.

According to another aspect of the invention, some fingerprints of the underlying deduplicated storage system are shared and utilized by the fingerprint index of the cache system. According to one embodiment, the file extents cached in the cache memory system are compressed into a write-evict unit (WEU) with some other file extents. The WEU is then stored in the cache memory device. The size of a WEU may match an erasure unit size of that particular cache memory device. When storing cached data into the cache memory device, an entire WEU is written and/or evicted to improve the lifespan of the cache memory device. When accessing the cached data, a file extent is read (which can be smaller than a WEU).

Deduplicated Cache System Architectures

FIG. 1 is a block diagram illustrating a storage system according to one embodiment of the invention. Referring to FIG. 1, system 100 includes, but is not limited to, one or more client systems 101-102 communicatively coupled to storage system 104 over network 103. Clients 101-102 may be any type of clients such as a server, a personal computer (e.g., desktops, laptops, and tablets), a "thin" client, a personal digital assistant (PDA), a Web enabled appliance, a gaming device, a media player, or a mobile phone (e.g., Smartphone), etc. Alternatively, any of clients 101-102 may be a primary storage system that provides storage to other local clients, which may periodically back up the content stored therein to a backup storage system, such as storage system 104. Network 103 may be any type of networks such as a local area network (LAN), a wide area network (WAN) such as the Internet, a fiber network, a storage network, or a combination thereof, wired or wireless. Clients 101-102 may be in physical proximity or may be physically remote from one another. Storage system 104 may be located in proximity to one, both, or neither of clients 101-102.

Storage system 104 may be used as any type of server or cluster of servers. For example, storage system 104 may be a storage server used for any of various different purposes, such as to provide multiple users with access to shared data and/or to back up data (e.g., mission critical data). In one embodiment, storage system 104 includes, but is not limited to, file manager 117, cache management layer 106, deduplication storage engine 107, storage units 108-109, and cache memory device (or simply referred to as cache) 114 communicatively coupled to each other. Storage units 108-109 and cache 114 may be implemented locally (e.g., single node operating environment) or remotely (e.g., multi-node operating environment) via interconnect 120, which may be a bus and/or a network (e.g., a storage network or a network similar to network 103). Storage units 108-109 may include a single storage device such as a hard disk, a tape drive, a semiconductor memory, a plurality of storage devices such as a redundant array system (e.g., a redundant array of independent disks (RAID)), a system for storage such as a library system or network attached storage system, or any other appropriate storage device or system. Note the terms "cache memory device" and "cache" are used interchangeably within the specification, and a cache memory device can be volatile or non-volatile devices.

File manager 117 may be executed by a processor to provide an interface to access files stored in storage units 108-109 and cache 114. Cache management layer 106 contains cache manager 115, file index 116, and optionally fingerprint (FP) index 113. Cache management layer 106 and file manager 117 reside in memory of a processor in one embodiment.

In one embodiment, file index 116 is used to access data cached in cache memory device 114. Fingerprint index 113 is used to deduplicate the data stored in cache memory device 114. When data such as data objects 112-113 is accessed in the underlying storage system, the data may be cached in cache memory device 114, in this example, a non-volatile memory device such as a solid state drive (SSD) or other flash memory device. In response to receiving a request to cache a file extent of a file, its fingerprint is generated and used by cache manager 115 to look up in the fingerprint index 113 to determine whether any fingerprint entry matching the fingerprint is found. If so, that means the corresponding data has already been stored in the cache memory device 114 as a file extent. The file is associated with the storage location that caches the file extent by creating or inserting a file extent entry into the file index 116.

According to one embodiment of the invention, the fingerprint index 113 is a partial index that only covers portions of the file extents stored in the cache memory device 114. An efficient insertion and eviction mechanism is employed to maintain the fingerprint index in a relatively small size. A variety of replacement policies can be utilized to determine which of the file fingerprint entries should be inserted or evicted from the fingerprint index 113. In addition, cache management layer 106 uses other insertion and eviction policies to determine which file extents should be kept in the cache and referenced by the file index 116. In one embodiment, each of the file extent entries in the file index 116 may be associated with a list of one or more linked nodes that collectively represent a file extent. Each node includes a bitmap having multiple bits, each corresponding to one of the data blocks within the corresponding extent associated with the node. The bitmap is to indicate which of the data blocks within the file extent are valid.

According to another embodiment of the invention, some of the fingerprints of the underlying deduplicated storage system (e.g., fingerprints as part of metadata 110-111) are shared with and utilized by the fingerprint index 113 of the cache management layer 106. According to one embodiment, the file extents cached in the cache memory device 114 are compressed into a write-evict unit (WEU) together with some other file extents from the same file or different files. The WEU is then stored in the cache memory device. The size of a WEU may match an erasure unit size of that particular cache memory device. When storing data into the cache memory device 114, an entire WEU is written or evicted to improve the lifespan of the cache memory device 114. When accessing data stored in the cache memory device 114, a file extent is read. In some embodiments, a file extent is significantly smaller than a WEU, which reduces the amount of excess data read to satisfy a request. In some embodiments, a file extent is the unit of compression so that only a file extent is needed to be read in order to decompress and return the requested data which is part of that file extent.

Note while terminologies like cache management layer, cache manager, and cache memory devices are utilized in discussion of embodiments of the invention, the invention applies to a multi-tier or multi-layer storage architecture. In other words, unless specified, the discussed embodiments of the invention apply to a multi-tier system or multi-layer architecture where the storage contains more than one tier or one layer, and the tier and layer closer to memory is not a cache.

The operations of storing file data in the cache memory device 114 are discussed in detail herein below. For storing file data in storage units 108-109, deduplication storage engine 107 is configured to segment the file data into multiple chunks (also referred to as segments) according to a variety of segmentation policies or rules. Deduplication storage engine 107 may choose not to store a chunk in a storage unit if the chunk has been previously stored in the storage unit. In the event that deduplication storage engine 107 chooses not to store the chunk in the storage unit, it stores metadata enabling the reconstruction of the file using the previously stored chunk. As a result, chunks of file data are stored in a deduplicated manner, either within each of storage units 108-109 or across at least some of storage units 108-109. The metadata, such as metadata 110-111, may be stored in at least some of storage units 108-109, such that files can be accessed independent of another storage unit. Metadata of each storage unit includes enough information to provide access to the files it contains.

In one embodiment, the metadata information includes a file name, a storage unit where the segments associated with the file name are stored, reconstruction information for the file using the segments, and any other appropriate metadata information. In one embodiment, a copy of the metadata is stored on a storage unit for files stored on a storage unit so that files that are stored on the storage unit can be accessed using only the information stored on the storage unit. In one embodiment, a main set of metadata information can be reconstructed by using information of all storage units associated with the storage system in the event that the main metadata is lost, corrupted, damaged, etc. Metadata for a storage unit can be reconstructed using metadata information stored on a main storage unit or other storage unit or units (e.g., replica storage unit). Metadata information further includes index information (e.g., location information for segments in storage units). In one embodiment, metadata includes prime segment information that can be used to provide a consistent point of a file system and/or reconstruct a file system in the event of file system failure.

Figure 2:
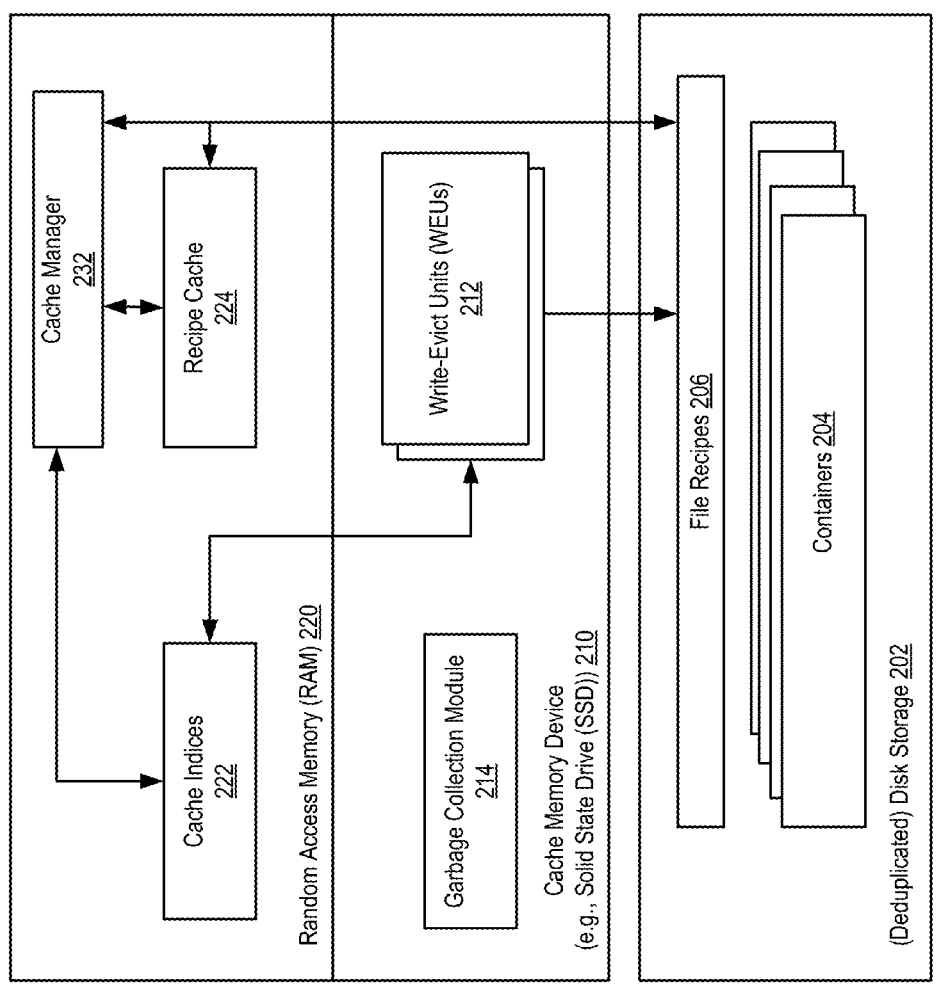
FIG. 2 illustrates a three-layer architecture of a protection integrated primary (PIP) storage according to one embodiment of the invention.

FIG. 2 illustrates a three-layer architecture of a protection integrated primary (PIP) storage according to one embodiment of the invention. At the bottom layer of the PIP storage is disk storage 202, which may be implemented using hard drives for large capacity. Disk storage 202 may be deduplicated in one embodiment. Disk storage 202 includes containers 204 to store data files, which contain segmented chunks after deduplication in one embodiment. Disk storage 202 also contains file recipes 206, including file handles, fingerprints of data and fingerprints of metadata such as in nodes of a Merkle tree. A Merkle tree can be used as a file recipe to provide access to file data in which the bottom ($0^{th}$) level is the data, the $1^{st}$ level contains the fingerprints of consecutive regions of data (grouped into segments) and the upper levels are fingerprints of the segments of the level below.

The middle layer of the three-layer architecture is a cache memory device (such as a solid state device, SSD or flash memory) 210, or simply referred to as cache, to accelerate performance. In cache 210, data are stored and evicted using a basic data structure referred to as a write-evict unit (WEU) represented by WEUs 212 in FIG. 2. Garbage collection module 214 is configured to evict WEUs no longer needed and free space to cache WEUs for new requests. The formation and operations of WEU are discussed in detail herein below. The need of a WEU stems from the fact that cache 210 may use storage medium different from disk storage 202.

In one embodiment, the cache 210 is made of SSD, and SSD has unique properties that must be considered (these techniques/properties also generally apply to any flash-based storage device such as PCIe-based flash devices). For example, a SSD storage unit must be explicitly erased before being overwritten, and the unit of erasure (up to MB(s) in size) is much larger than the unit of individual writes in a disk storage (e.g., 4 kilobytes). In addition, writes wear out the SSD storage over time; therefore, less frequent writing is more desirable.

Cache 210 uses WEU as its basic data structure, different from data structures such as chunks used in containers 204 of the underlying storage 202. WEU is formed by multiple (and compressed) extents, which may be comprised of fixed-size blocks representing consecutive bytes (often many kilobytes) according to one embodiment of the invention. The consecutive bytes are within a single file in one embodiment. Extents may be the same as or different from chunks depending on implementation. An extent is the access unit size (the unit of read from the cache) that is performed by the cache system in response to a request to access a file block of a file. A block (also referred to as a file block) is a data unit of each IO request to read or write to the underlying storage system. In this example, data requested by a higher file system layer (such as NFS) is in the form of block requests, which are converted to extent requests in the cache, while data being written in cache memory device 210 is in a form of a WEU. A WEU includes multiple extents, each of which is compressed therein where each extent can be independently read and accessed to satisfy read requests from the higher layers of the file system. The size of a WEU may be configured to match an erasure unit size of cache memory device 210, which depends upon the specification or characteristics of the cache memory device 210. As a result, the lifespan of the cache memory device 210 can be improved. Further detailed information concerning a WEU will be described in details further below.

The upper layer is random access memory (RAM) 220, which may be part of system memory of a storage system such as storage system 104 of FIG. 1. RAM 220 may be dynamic RAM (DRAM) or non-volatile RAM (NVRAM) or a combination thereof in one embodiment. RAM 220 contains cache manager 232, which interacts with recipe cache 224 (for storing Merkle tree segments and caching portions of the fingerprint index of the underlying storage system) to accelerate reading from and writing data to disk storage 202. In addition cache manager 232 interacts with cache indices 222 (such as fingerprint index 113 and file index 116 illustrated in FIG. 1) to read from and write to cache device 210. Note RAM 220 also contains a garbage collection module (not shown). Also note that cache indices 222 interact with WEUs 212 for data caching in and evicting from cache 210 to accelerate system performance. Note the protection integrated primary (PIP) storage of FIG. 2 may be implemented as the storage system 104 of FIG. 1.

Figure 3A:
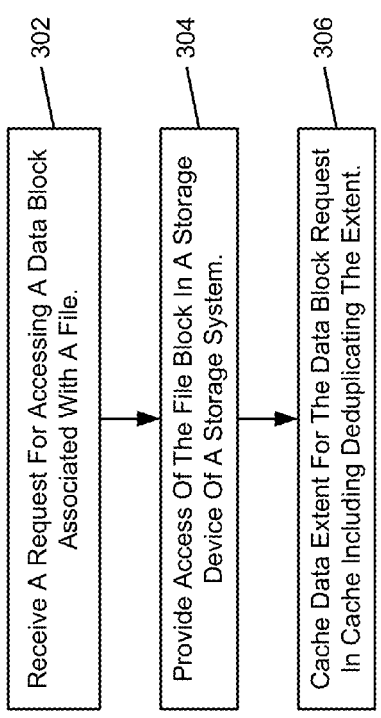
FIGS. 3A-B are flow diagrams illustrating operations of a deduplicated cache system architecture according to one embodiment of the invention.
Figure 3B:
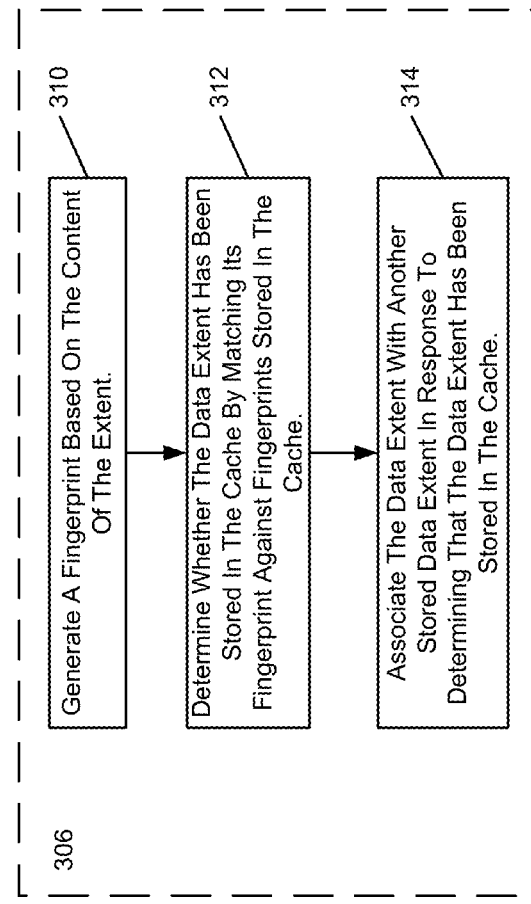

FIGS. 3A-B are flow diagrams illustrating operations of a deduplicated cache system architecture according to one embodiment of the invention. The operations may be performed by storage system 104 as illustrated in FIG. 1.

Referring to FIG. 3A, at reference 302, a request for accessing a data block associated with a file (e.g., file block) is received at a storage system. In one embodiment, a data block referred to herein is in a form of a part of an extent. At reference 304, a file manager of the storage system provides access of the requested data block in a persistent storage device of the storage system. The persistent storage device may be a disk storage device in one embodiment. Then at reference 306, a cache manager of the storage system caches the data block in conjunction with its surrounding extent in a cache, where the data extent is deduplicated. In the cache, at least some of the data extents are deduplicated data extents, and at least one of the data extents in the cache is referenced by different regions of an identical file or different files.

In one embodiment, caching the data extent at reference 306 includes operations illustrated in FIG. 3B. Referring to FIG. 3B, at reference 310, a fingerprint based on the content of the data extent is generated. At reference 312, it is determined whether the data extent of the file has been stored in the cache by matching the fingerprint against fingerprints of the data extents that have been stored in the cache. Then if the data extent has already been stored in the cache as a data extent of another file or the same file at a different file location, the data extent is associated with the existing data extent at the cache at reference 314. Note that the existing data extent may be cached in the cache during a caching process of another file and the caching process may be different from the current file.

Also note, in one embodiment, matching the fingerprint and associating the data extent with the existing data extent at the cache utilizes cache indices such as fingerprint index and file index as discussed in more details herein below.

Packing and Storing Cached Data in Deduplicated Cache System

Figure 4:
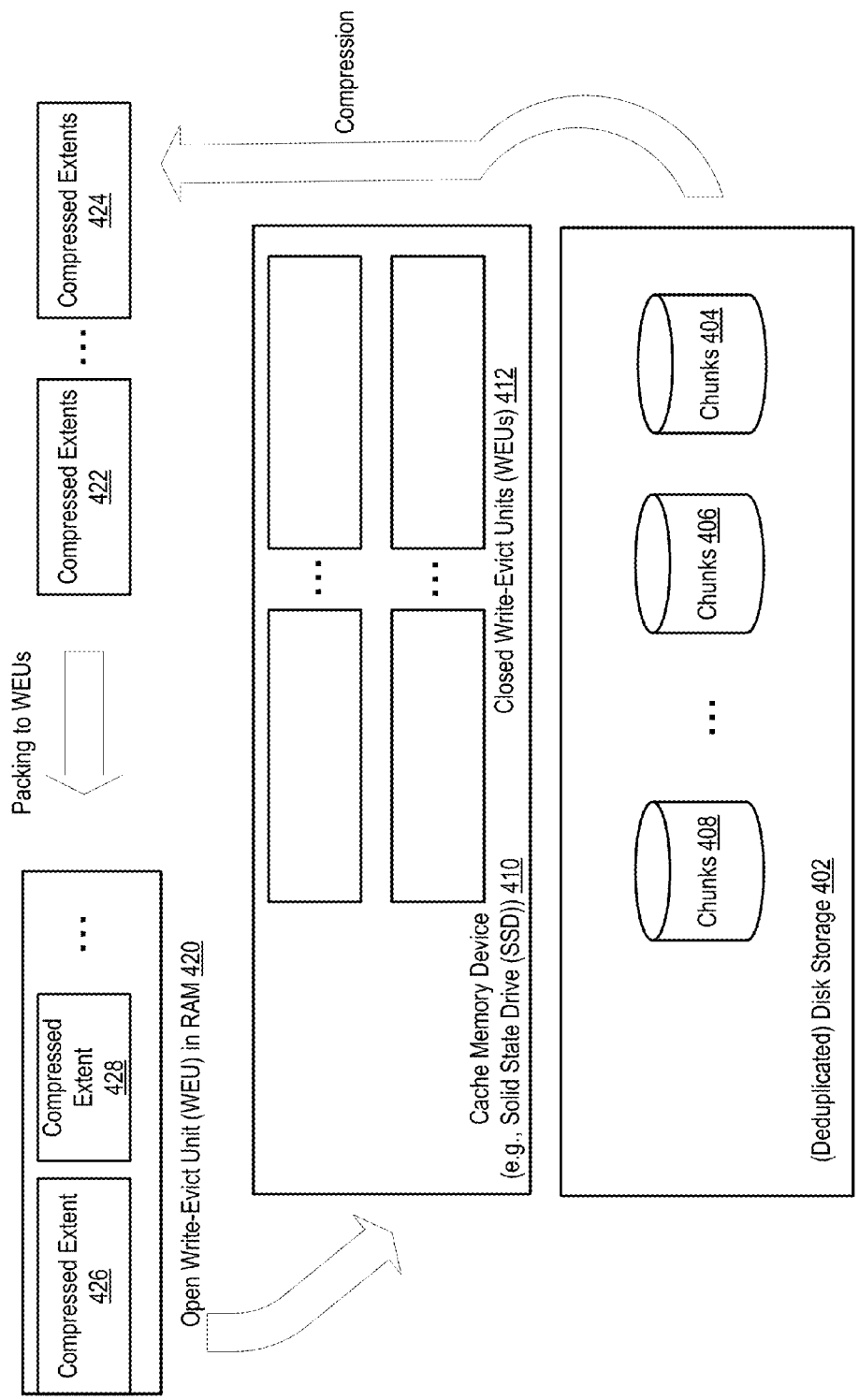
FIG. 4 illustrates the process of packing and storing cached data in a deduplicated cache system according to one embodiment of the invention.

In one embodiment, data blocks stored in cache of storage system 104 illustrated in FIG. 1 are arranged into extents and WEUs instead of chunks in storage units 108-109. FIG. 4 illustrates the process of packing and storing cached data in a deduplicated cache system according to one embodiment of the invention. Data are stored in chunks in deduplicated disk storage 402. Data may also be stored in some other types of storage with a different data block format. In the deduplicated cache system, data blocks stored as chunks or other format in the underlying storage system are grouped into file extents (or simply extents), which are comprised of multiple consecutive blocks of data of a file in one embodiment. Data Chunks 404-408 (or other format of extents) are compressed to compressed extents 422-424. Extents after compression may have various sizes. The compressed extents 422-424 are packed into a write-evict unit (WEU), WEU 420, which is referred to as open WEU to designate the WEU can still pack more compressed extents. The open WEU 420 already contains compressed extents 426 and 428, and compressed extents 422 and 424 are packed into open WEU 420 after being compressed using a variety of compression algorithms. The size of the WEU is determined based on accessing characteristics of the cache. For example, an extent has a size of 32K bytes, and a WEU has a size of 1 M bytes, thus multiple extents are compressed and packed into a single open WEU. Once open WEU 420 is filled completely with extents, it becomes closed, and will be inserted into a cache, such as SSD 410, which already contains multiple closed WEUs at reference 412. Note each extent is associated with a header or a trailer containing a variety of information regarding the extent. An embodiment of extent header is discussed herein below in connection with discussion of FIG. 7.

As cache is often fully populated, writing a WEU into the cache entails evicting some other WEUs from the cache. A least-recently-used (LRU) policy (or more generally some other cache replacement policy) may be used to select which WEU to evict according to one embodiment of the invention. An access time for a WEU is initially set when it is written to the cache and updated when there are reads or writes that access extents within the WEU. The access times are tracked at the WEU level instead of at the extent level. The access time for WEUs is maintained in memory, for example, through a cache manager such as cache manager 115 of FIG. 1. The cache manager maintains access time for WEUs and determines LRU status of WEUs. Once a new WEU needs to be inserted, and the cache is fully populated, the cache manager selects the WEU with the earliest access time to evict, and then inserts the new WEU. A feature of WEU management in a deduplicated cache system is the generation ID of a WEU, which will be discussed in detail herein below. While LRU is discussed throughout this document, it should be understood that numerous other cache replacement algorithms are possible such as most-recently-used, least-frequently-used, as well as combinations of policies.

Indexing Architecture in Deduplicated Cache System

Figure 5:
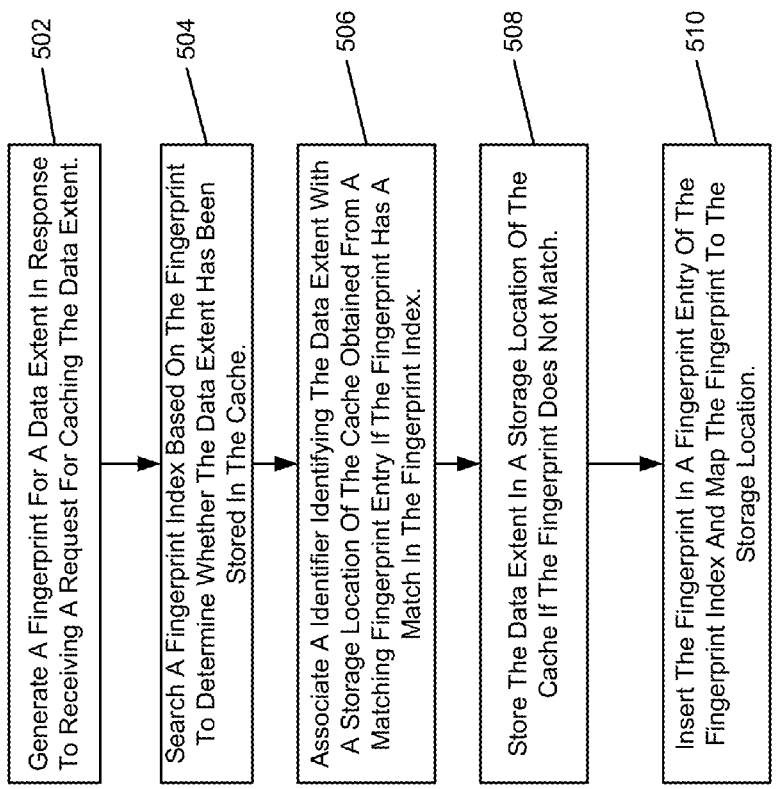
FIG. 5 is a flow diagram illustrating searching and storing a data extent utilizing a Fingerprint index according to one embodiment of the invention.

In one embodiment, indices such as fingerprint (FP) index 113 and file index 116 are utilized to effectively manage WEUs in a deduplicated cache system. FIG. 5 is a flow diagram illustrating searching and storing a data block utilizing a Fingerprint index according to one embodiment of the invention. The process may be performed at cache manager 115 of FIG. 1, which may be implemented as processing logic in software, hardware, or a combination thereof.

Referring to FIG. 5, the process starts with generating a fingerprint for a data extent in response to receiving a request for caching the data extent of a file at reference 502. Based on the generated fingerprint, the cache manager search in a fingerprint index to determine whether the data extent has been stored in the cache at block 504. The fingerprint index includes a number of fingerprint entries, and each fingerprint entry maps a fingerprint to a particular storage location of the cache in which a corresponding data extent is stored.

If a matching fingerprint entry is found in the fingerprint index at reference 506, the cache manager associates an identifier identifying the data extent and the file with a storage location of the cache obtained from the matching fingerprint entry, while the data extent itself is not stored in the cache.

If a matching fingerprint entry is not found in the fingerprint index at reference 508, the cache manager stores the data extent at a location within the cache. Then at reference 510, the cache manager inserts the generated fingerprint in a fingerprint entry of the fingerprint index, and maps the fingerprint to the location within the cache.

Figure 6:
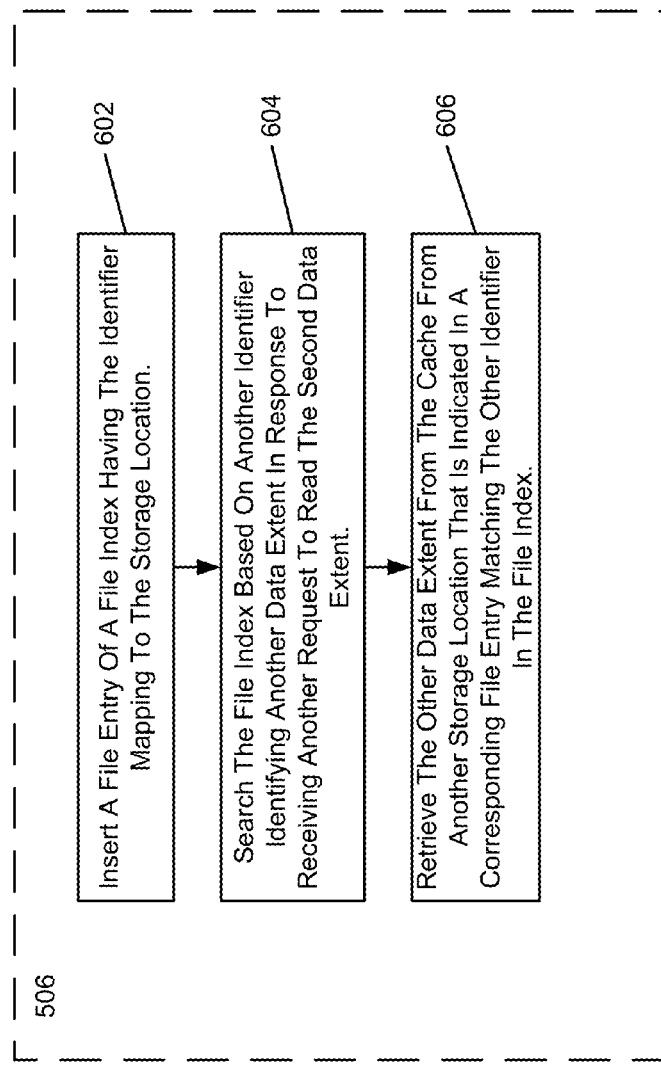
FIG. 6 is a flow diagram illustrating operation of a file index in a deduplicated cache system according to one embodiment of the invention.

In one embodiment, associating the identifier of an extent with a storage location utilizes a file index. FIG. 6 is a flow diagram illustrating operation of a file index in a deduplicated cache system according to one embodiment of the invention. The operations of FIG. 6 are a zoom-in of reference 506 of FIG. 5, where the cache manager associates the identifier identifying the data extent and the file with the storage location of the cache. Referring to FIG. 6, the association starts at reference 602 with inserting a file entry in a file index, where the file entry has the identifier mapping to the storage location of the cache. The file index is utilized to access the deduplicated data extents stored in the cache. At reference 604, in response to receiving another request to read another data extent from the cache, the cache manager searches the file index based on another identifier identifying the data extent of another file. Then the cache manager retrieves the other data extent from the cache at another storage location that is identified in a corresponding file entry in the file index.

In one embodiment, there are two types of file entries in the file index. One is a base entry, which is the first entry pointing to a file extent at a particular cache location. The other is a duplicate entry, which points to the extent at the particular cache location of a base entry. There may be multiple duplicate entries for a base entry. By using base/duplicate entries instead of a single type of entry for all data extents, the file index is easier to maintain and also easier to interact with a fingerprint index containing fingerprints of the data extents. In one embodiment, instead of a single file index, two different indices can be formed, and one is for the base entries and the other for the duplicate entries.

Note that each data block is stored within a file extent of a write-evict unit (WEU) in one embodiment as discussed herein above, and the size of the WEU is determined based on accessing characteristics of the cache.

Figure 7A:
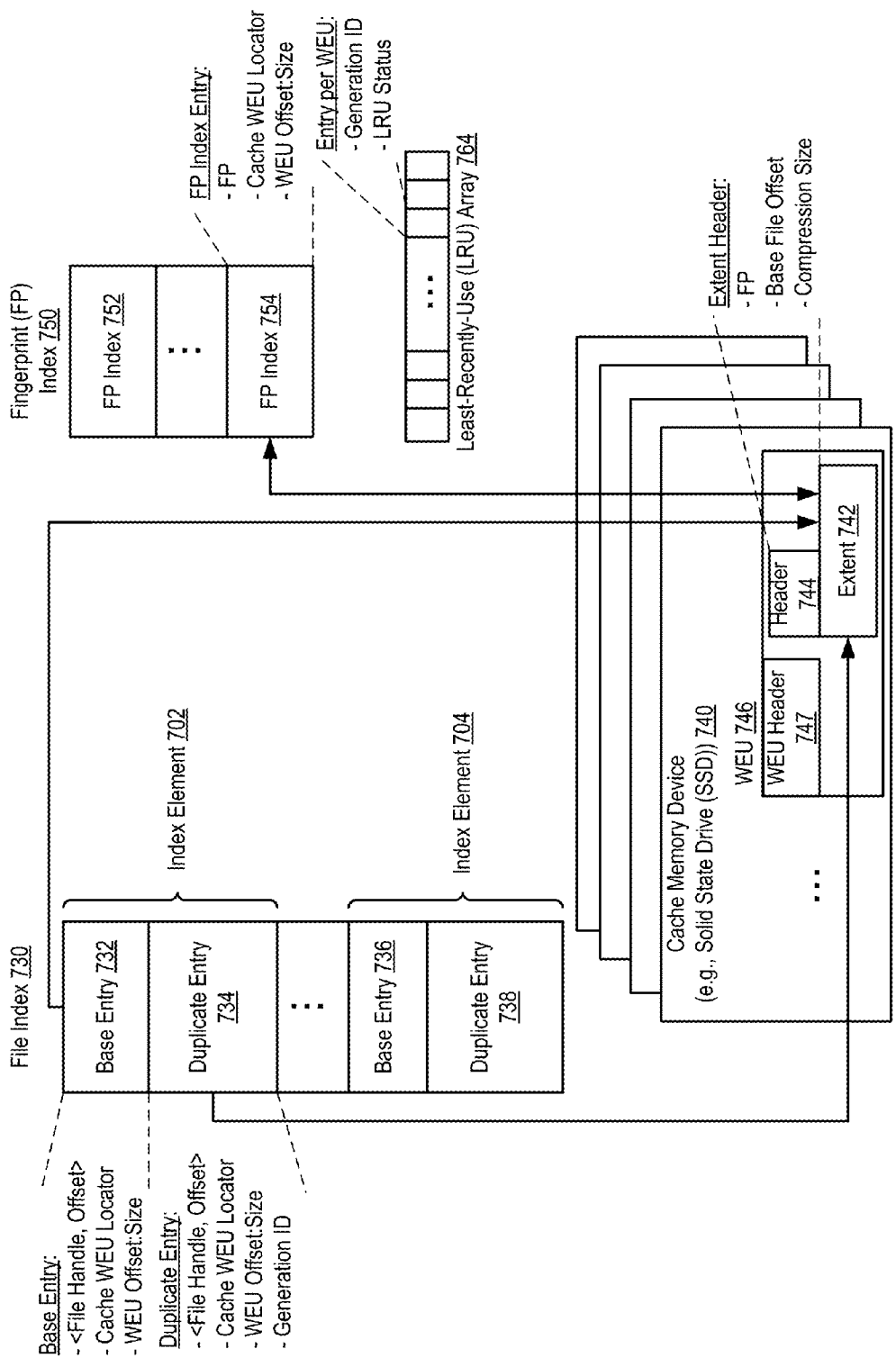
FIGS. 7A-B illustrate indexing architectures in a deduplicated cache system according to embodiments of the invention.

FIG. 7A illustrates an indexing architecture in a deduplicated cache system according to one embodiment of the invention. In FIG. 7A, the cache memory device (or simply cache) is at reference 740. Cache 740 can be a solid-state device, a flash memory, or another suitable storage medium. Cache 740 contains a number of write-evict units (WEUs) such as WEU 746. Each WEU contains a WEU header such as WEU header 747, and a number of extents such as extent 742. Each extent such as extent 742 has an associated header such as header 744. Extent header 744 contains fingerprint of the extent, and a base <file handle, offset>, which is described herein below, and a compression size in one embodiment. WEU header 747 may contain a copy of the extent headers for the extents within WEU 746 (as well as other metadata). The information in WEU header 747 may be used to accelerate the boot up of cache 740.

File index 730 contains a number of index elements such as index elements 702 and 704. The index contains one or more base entries, and it may also contain one or more duplicate entries. For example, index element 702 contains base entry 732 and duplicate entry 734. Entries contain an identifier identifying a file region of a file. In some embodiments, the identifier will be in a form of a file handle and an offset. In some embodiments, the identifier will be in a form of LUN ID (Logical Storage Unit ID) and offset. Throughout the description and claims, we refer herein to <file handle, offset>, which will be understood to mean any such identifier such as file handle and offset, LUN ID and offset, or more generically object ID and offset. The <file handle, offset> may at times be represented by a hash of the <file handle, offset>. In one embodiment, a base entry contains a <file handle, offset>, a cache WEU locator indicating the WEU the base entry points to, and a WEU offset indicating a particular extent within the WEU. Similarly, a duplicate entry indicates <file handle, offset>, a cache WEU locator, and a WEU offset. In addition, a duplicate entry also includes a generation identifier, which will be explained in more details herein below.

Note that while <file handle, offset> is used for a network file system (NFS) in this example, other ways to identify data location within a file are feasible for other file systems such as a common Internet file system (CIFS), a virtual tape library interface (VTL), a small computer system interface (SCSI) system, etc. The principle of embodiments of this invention is agnostic to a particular file system or network file system protocol, thus unless specified otherwise in the specification, while <file handle, offset> is utilized for a file in discussion of embodiments of the invention, other means for CIFS, VTL, SCSI, or other applicable systems can also be utilized for indexing and identification of data in embodiments of the invention.

Fingerprint index 750 contains fingerprint entries. Each fingerprint entry includes a fingerprint, a cache WEU locator indicating the WEU containing data and a WEU offset indicating a particular extent within the WEU. Note that base entry 732, duplicate entry 734, and fingerprint index 754 all point to the same extent, extent 742. Each extent, such as extent 742, contains a header, which includes a fingerprint of the data within the extent, a base <file handle, offset>, and a compression size indicating the length of the extent. In an alternate embodiment, a trailer of an extent is implemented, containing similar or a different format to identify the extent. The header or trailer of an extent may be associated with the extent without being closely stored together in the WEU.

Figure 7B:
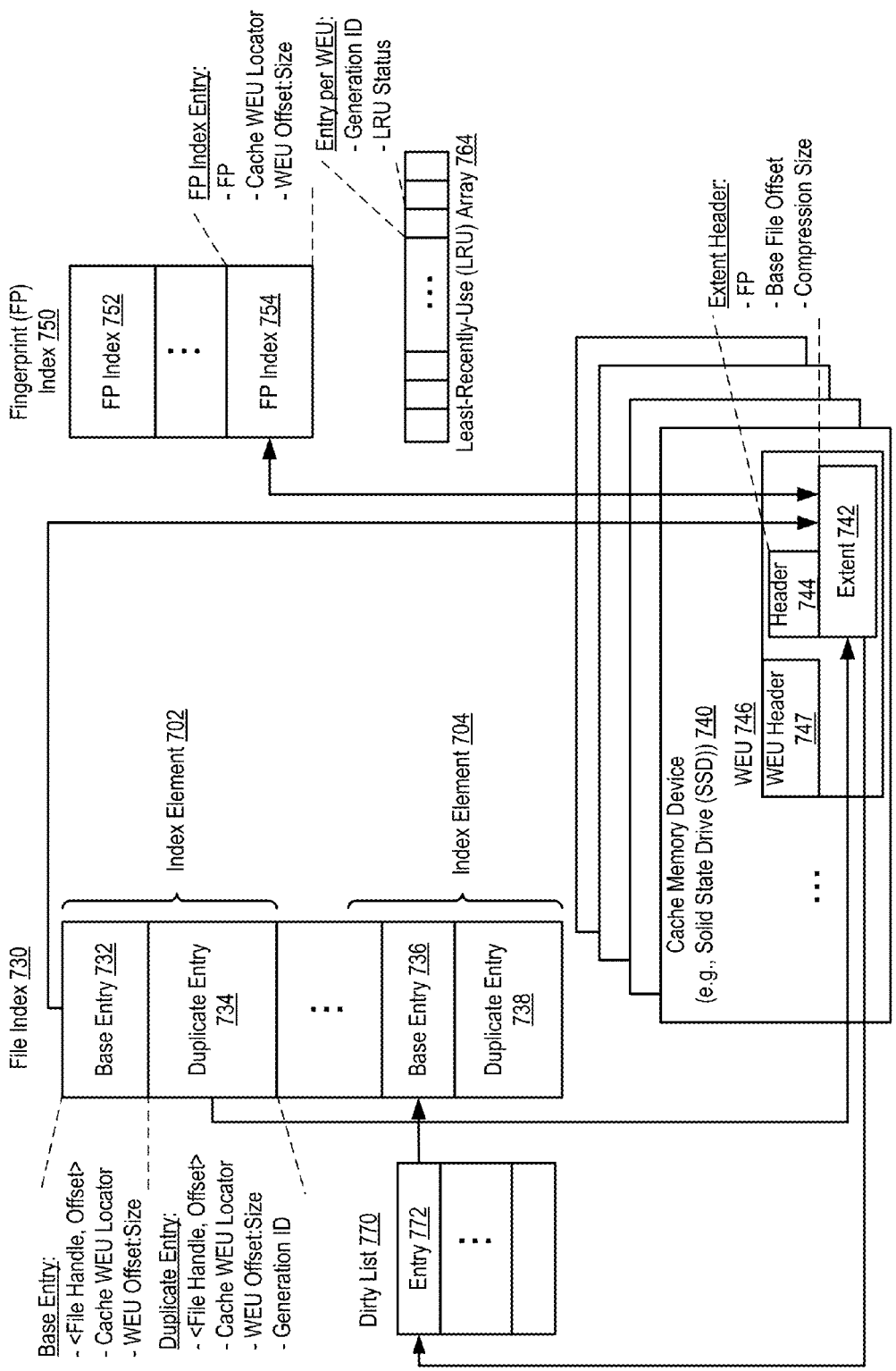

FIG. 7B illustrates an embodiment that supports write-back mode for a deduplicated cache system. In write-back mode, extents written by a client are inserted into the cache and not immediately stored to an underlying storage system. In write-back mode, the cache therefore holds extents that contain content that is newer than content in the storage system. We refer to these extents as dirty, while extents that have the same content as the storage system are referred to as clean. Dirty list 770 is used to keep track of dirty extents. In write-back mode, dirty extents and clean extents are optionally packaged into separate WEUs. Dirty list 770 is maintained in non-volatile RAM or other persistent storage that is fast to access for logging purposes. Entry 772 consists of reference to the extent's location in the cache consisting of the WEU locator, WEU offset, and compressed extent size. Dirty extents are written to the underlying storage system either when they are evicted from the cache or when the dirty list reaches a size threshold. In the latter case, the extent still exists in the cache and is considered clean.

FIGS. 8A-C illustrate formats of file index base entry, duplicate entry, and fingerprint index entry according to one embodiment of the invention. As illustrated in FIG. 8A, a file index base entry contains a 16 byte <file handle, offset> 802 indicating data location within a file, a four byte cache WEU locator 804 indicating the WEU location of the extent that the base entry is associated with, a four byte WEU offset 806 indicating the extent location within the WEU, and a 4 byte compressed extent size 808 indicating the number of bytes necessary to read from the WEU to access the compressed extent and its header. As illustrated in FIG. 8B, a file index duplicate entry contains a 16 byte <file handle, offset> 812 indicating data location within a file, a four byte cache WEU locator 814 indicating the WEU location of the extent that the base entry is associated with, a four byte WEU offset 816 indicating the extent location within the WEU, a two byte generation identifier (generation ID) 820, and a 4 byte compressed extent size 818 indicating the number of bytes necessary to read from the WEU to access the compressed extent and its header. Similarly, FIG. 8C illustrates a fingerprint index entry containing a 20 bytes fingerprint 822 for a particular extent the fingerprint index entry is associated with, a four byte cache WEU locator 824 indicating the WEU location of the extent that the base entry is associated with, a four byte WEU offset 826 indicating the extent location within the WEU, and a 4 byte compressed extent size 828 indicating the number of bytes necessary to read from the WEU to access the compressed extent and its header. Note the entries of each index and size of each entry is for illustration only, and more or less entries of different sizes may be utilized in a different embodiment.

Figure 9:
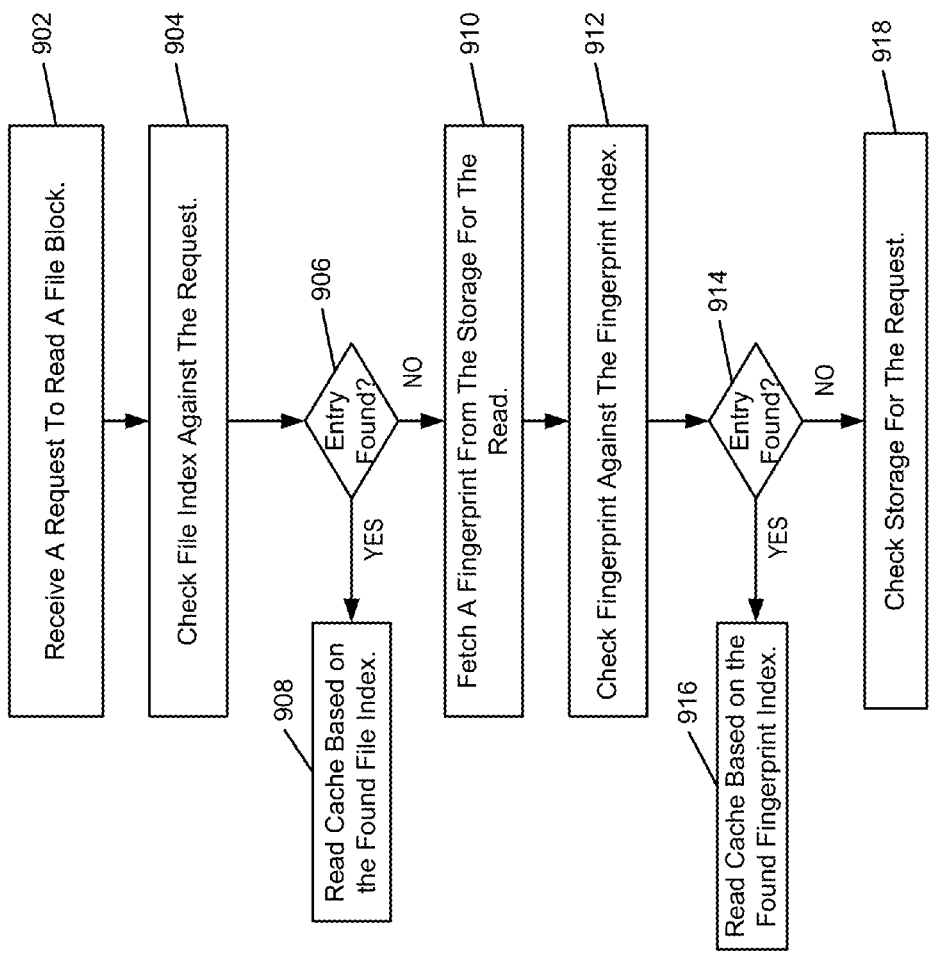
FIG. 9 is a flow diagram illustrating reading a file block through an indexing architecture according to one embodiment of the invention.

FIG. 9 is a flow diagram illustrating reading a data block through an indexing architecture according to one embodiment of the invention. The method can be performed by processing logic such as a cache manager 115 illustrated in FIG. 1.

Referring to FIG. 9, the cache manager receives a request to read a data block of a file at reference 902. The request contains a <file handle, offset> indicating the location of the requested data block within the file in one embodiment. At reference 904, the cache manager checks a file index associated with the cache based on the request. At reference 906, the cache manager determines whether an entry with matching <file handle, offset> is found. It may be necessary to convert from the file offset requested by the client by rounding down to the nearest multiple of the extent size supported by the cache. This entry may be either a base entry or a duplicate entry. If a matching base entry is found within the file index, the cache manager reads an extent from the cache at reference 908, based on the WEU locator and WEU offset information within the file index. If a matching duplicate entry is found within the file index, the cache manager further checks that the generation ID of the file index entry matches the generation ID associated with the WEU (either in the WEU header or in a separate memory location). If the generation ID matches, it is considered a match, and the cache manager reads the extent from the cache at reference 908. Otherwise, it is not considered a match, which is logically the same as when a matching base entry is not found within the file index. If the generation ID is not a match, then that entry is removed from the file index, since it is stale.

When a match is not found, at reference 910, the cache manager fetches the fingerprint for the extent containing the requested <file handle, offset> from the underlying storage system. In some embodiments, fetching the fingerprint for the extent may entail fetching multiple fingerprints for blocks within the extent and aggregating them, such as by using a strong hash function over the concatenation of the block fingerprints. The cache manager then checks the fetched fingerprint against the fingerprint index. At reference 914, the cache manager determines whether an entry with matching fingerprint is found in the fingerprint index. If a match is found, the flow goes to reference 916, and the cache manager reads an extent from the cache at reference 916, based on the WEU locator, WEU offset, and size information within the fingerprint index (in addition, a new file index entry can be created for the requested <file handle, offset> pointing to the extent indicated by the fingerprint index match). Otherwise, the flow goes to reference 918, and the cache manager goes to storage outside of the cache to find the requested data block. Note for the request for user read at the cache, the fingerprint index is not needed through the read path at references 902-908.

Figure 10:
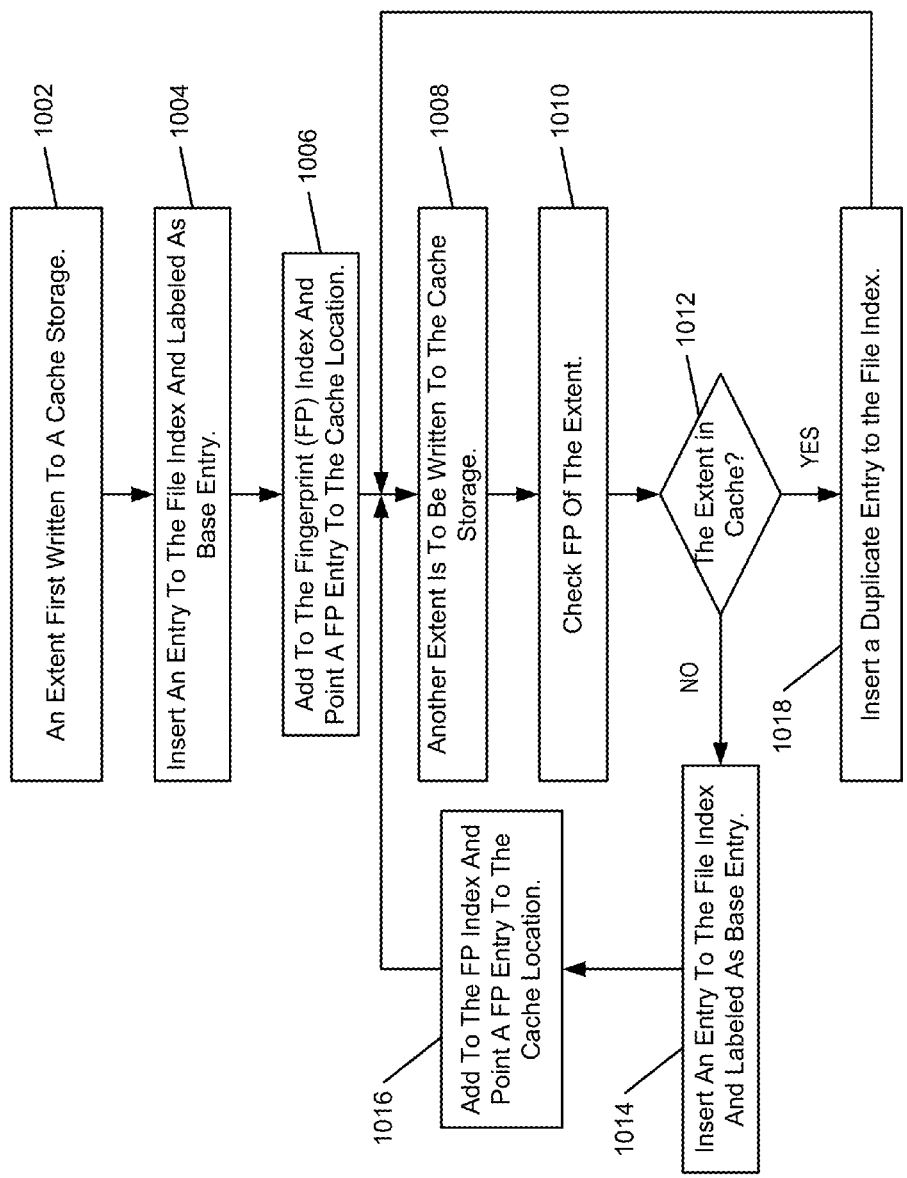
FIG. 10 is a flow diagram illustrating writing extents into a cache through an indexing architecture according to one embodiment of the invention.

FIG. 10 is a flow diagram illustrating writing extents into a cache through an indexing architecture according to one embodiment of the invention. The method can be performed at a cache manager 115 illustrated in FIG. 1.

Referring to FIG. 10, the cache manager first writes a new extent into a cache at reference 1002 (the cache manager has also computed the fingerprint of the extent at this point). An entry is inserted at reference 1004 to a file index associated with the indexing architecture and since this is a new extent, the entry is inserted as a base entry, and the base entry points to the extent location within the cache. At reference 1006, the cache manager adds an entry to the fingerprint index associated with the indexing architecture for the extent, and points the entry to the extent location within the cache.

At reference 1008, another extent is received to be written to the storage, and the cache manager computes and checks the fingerprint of the extent at reference 1010. At reference 1012, the cache manager determines if the extent is in the cache (thus being a duplicate). If the extent is not in the cache, at reference 1014, the cache manager inserts an entry into the file index and labels it to be a base entry. Then at reference 1016, the cache manager adds an entry to the fingerprint index and links the entry to the cache location, and the flow goes back to reference 1008 for the next extent to be written to the cache. If the extent is in the cache, at reference 1018, a duplicate entry is inserted into the file index pointing to the cache location indicated by the matching fingerprint index entry, and the flow also goes back to reference 1008 for the next extent to be written to the cache.

Generation ID in Deduplicated Cache System

In FIGS. 7A-B, a least-recently-used (LRU) array at reference 764 is illustrated according to one embodiment of the invention. The LRU array contains an entry for each WEU. Each entry contains a generation ID and a LRU status of the corresponding WEU. The usage of LRU status for WEUs has been discussed herein above, and here the generation ID is discussed in more details. Generation ID (short for identifier) is for confirming the validity of data read from the cache. As illustrated in FIGS. 7A-B, generation ID is used when reading duplicate entries but not base entries from the file index.

FIGS. 11A-H illustrate the usage of generation IDs in a deduplicated cache system according to one embodiment of the invention. The deduplicated cache system uses a solid-state device as a flash cache in this embodiment as an example, and each WEU uses a generation ID independent of other WEUs. In another embodiment, a global WEU counter is implemented, although the generation ID is still tracked per WEU. The size of a generation ID (number of bytes) is set to avoid issues of counter wrap-around in one embodiment.

Figure 11A:
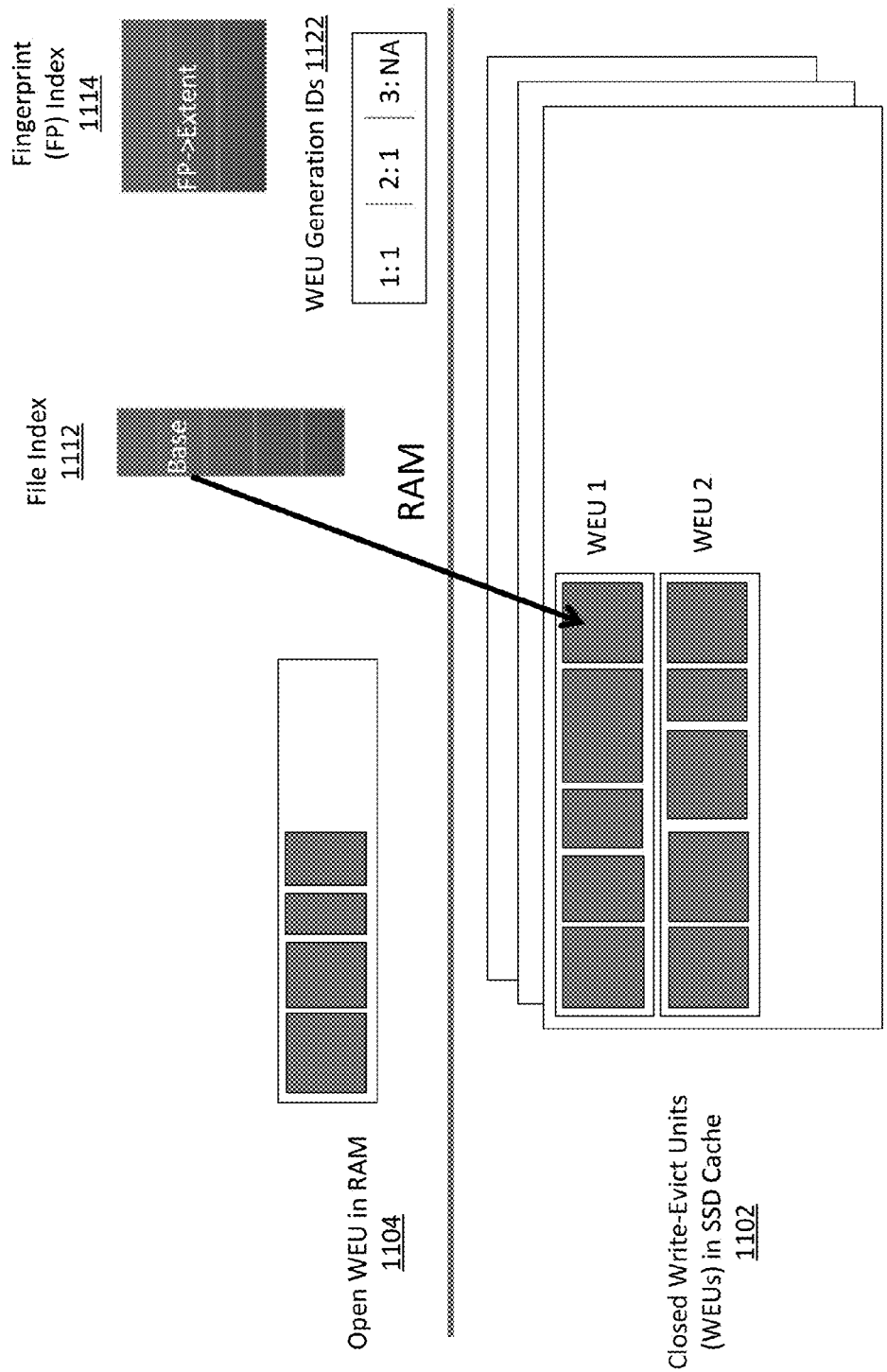
FIGS. 11A-H illustrate usage of generation IDs in a duplicated cache system according to one embodiment of the invention.

FIG. 11A illustrates an initial state of a deduplicated cache system. There are two closed WEUs (WEUs 1 and 2) in a SSD at reference 1102. Their generation IDs are set to 1 and WEU 3 has not yet been stored in SSD thus its generation ID is not available (NA). The generation IDs are shown at reference 1122. File index 1112 and fingerprint index 1114 are utilized respectively. An open WEU 1104 in RAM is being filled.

Figure 11B:
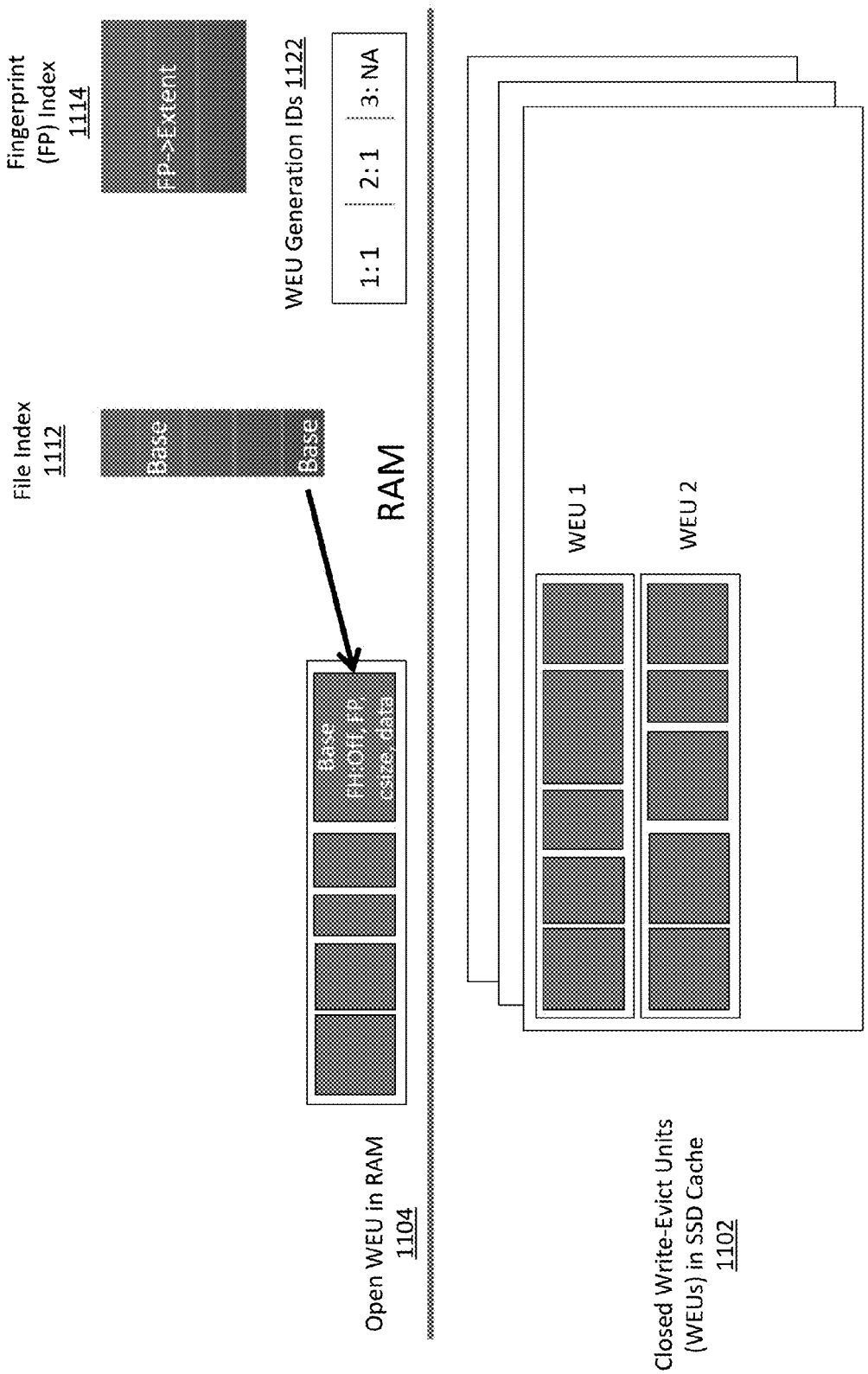

At FIG. 11B, a new extent is written to the open WEU. The extent is compressed and has a header with a base <file handle, offset>, fingerprint, compressed size, and the compressed data follows the header. Note that only one extent header is shown, but every extent has a header. For the extent, an entry is added to the file index 1112 and FP index 1114. There is no change to WEU generation IDs 1122.

Figure 11C:
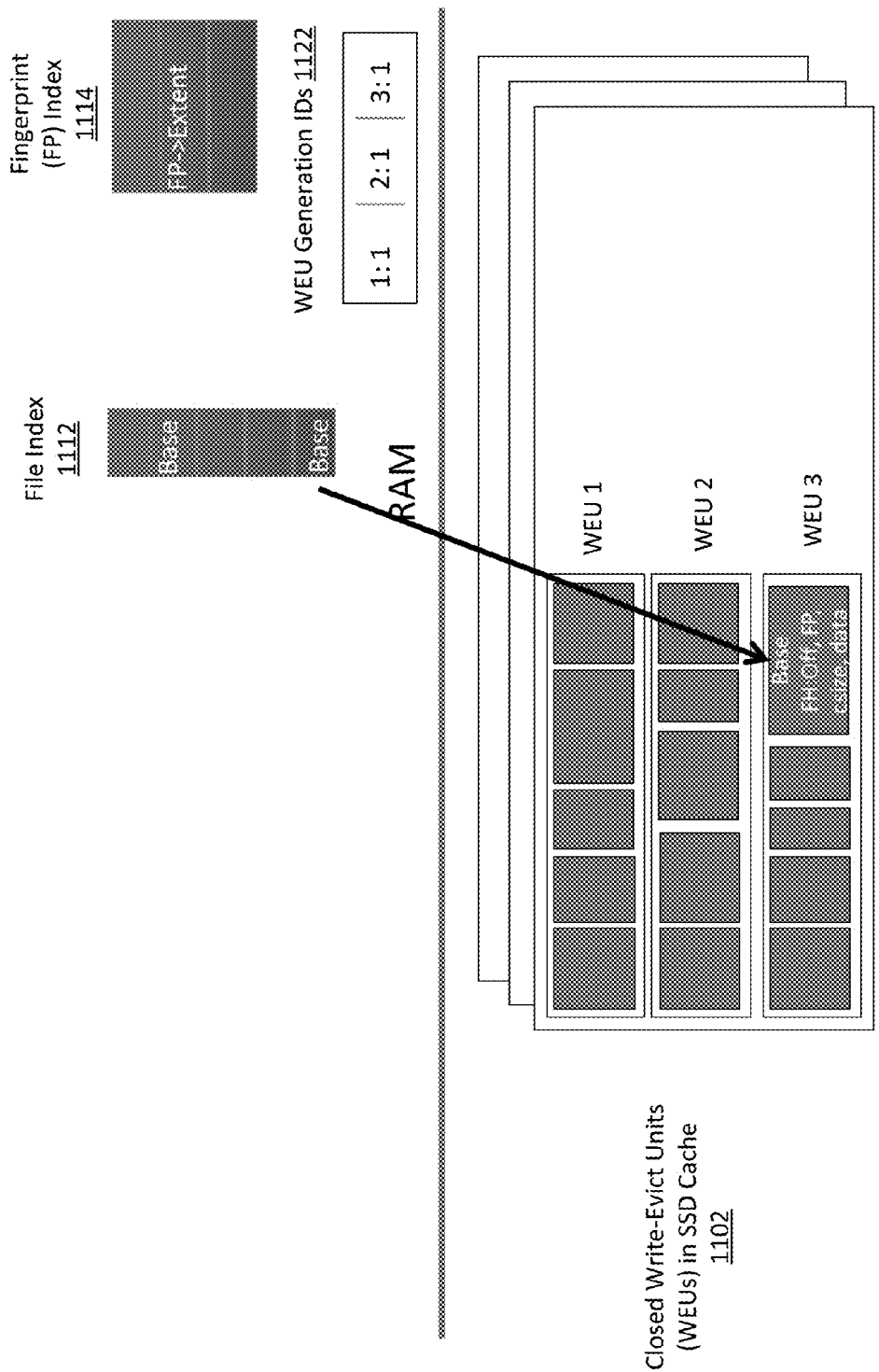

At FIG. 11C, the open WEU in RAM 1104 is full and written to the SSD cache, and now there are three WEUs in the SSD cache at reference 1102. The generation ID for WEU 3 is set to 1. Thus, all the WEUs have generation ID of 1 at reference 1122.

Figure 11D:
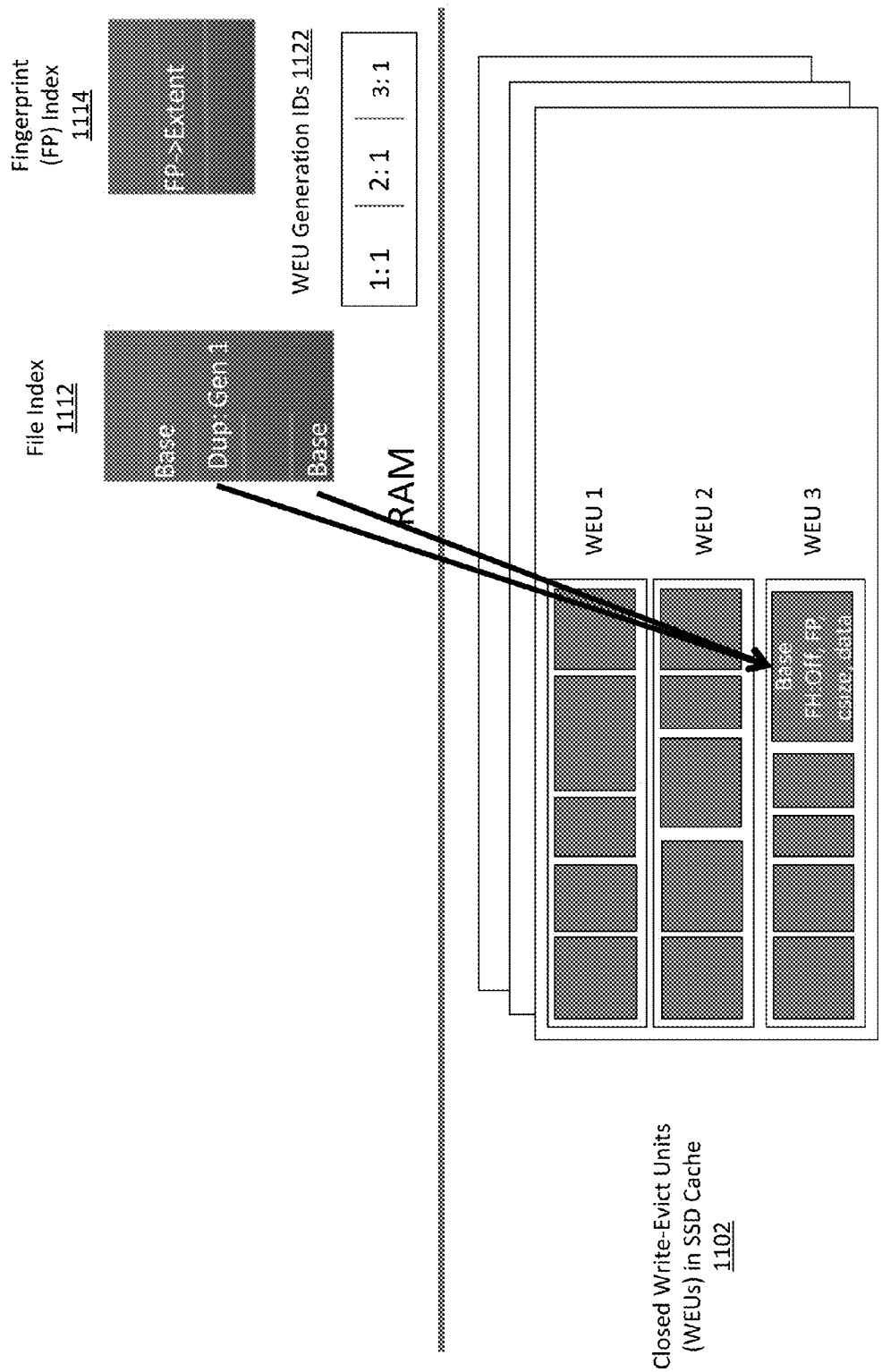

At FIG. 11D, another request to insert an extent into the cache is received, and because the extent is already in the cache, a duplicate entry is inserted in file index 1112. The duplicate entry points to an extent within WEU 3 in the SSD cache. The generation ID for the duplicate entry is set to 1 because that is the generation ID for WEU 3.

Figure 11E:
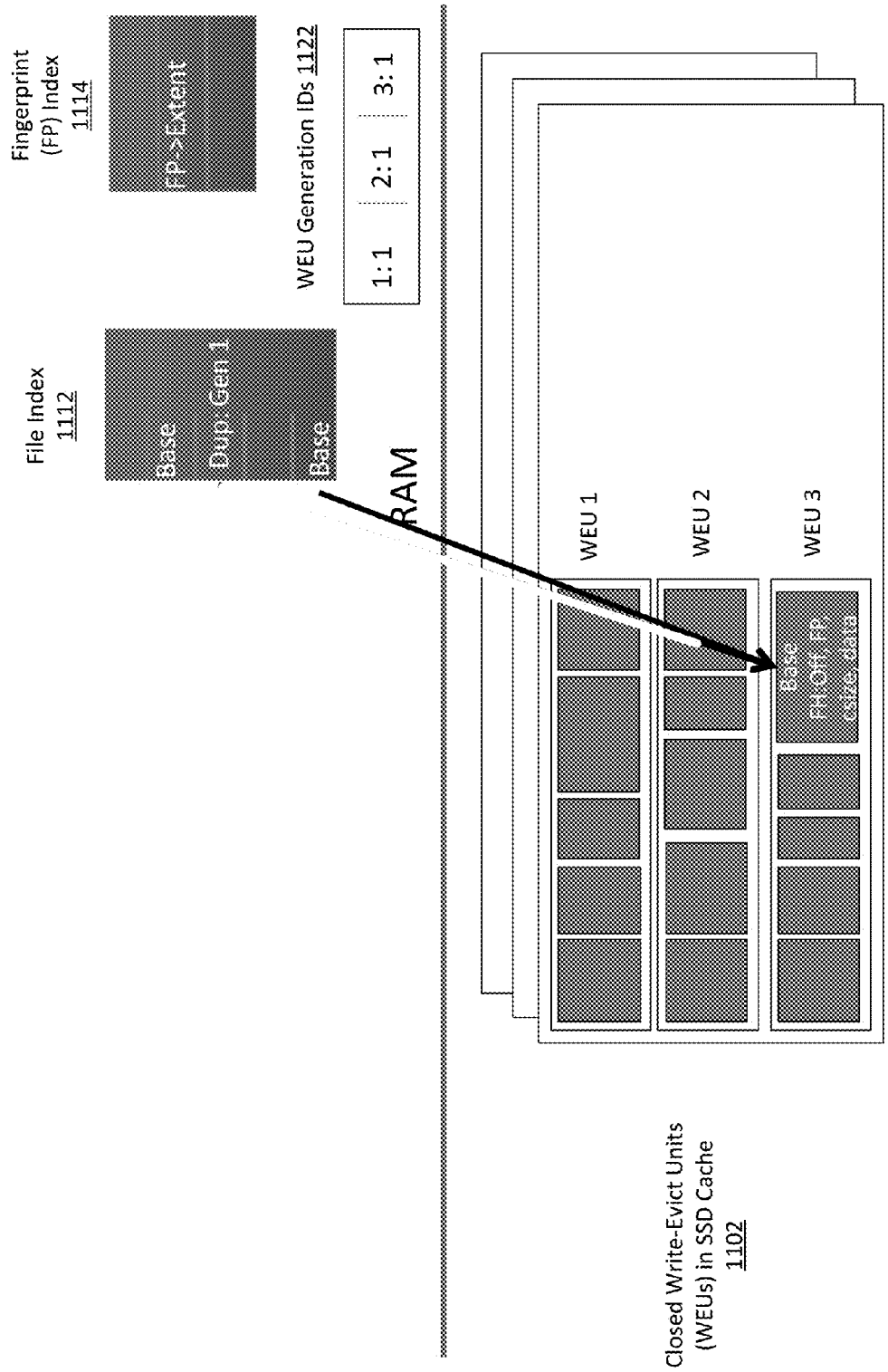

Then at FIG. 11E, a read request comes in for a base <file handle, offset>. The cache manager determines whether the requested data is in the SSD cache by checking file index 1112. The read request contains a matching base entry with the <file handle, offset> pointing to an extent in WEU 3. The extent is then decompressed and the cache manager responds with the requested data. Note generation ID is unchanged and unused for the read based on the base entry of file index 1112.

Figure 11F:
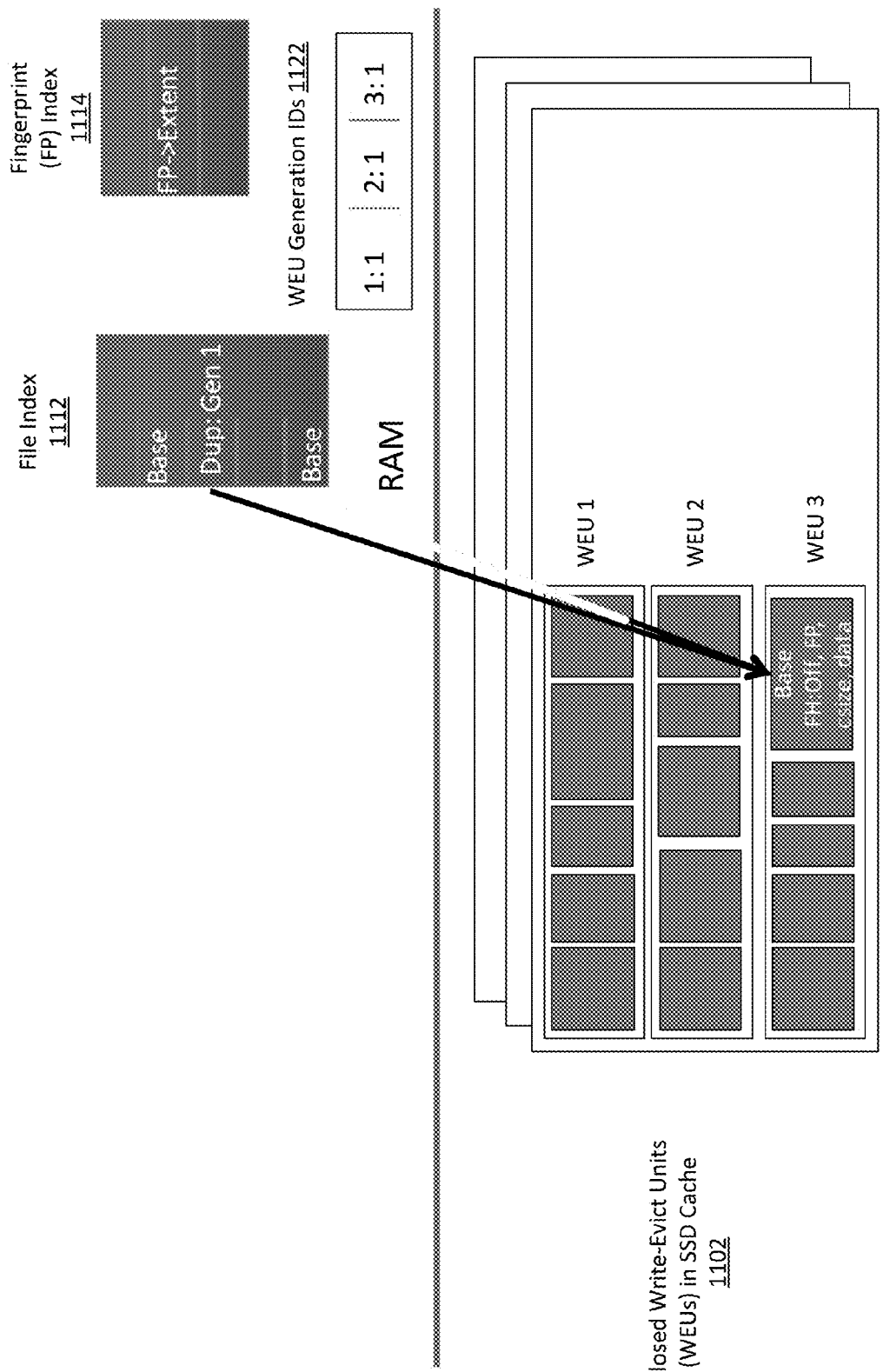

At FIG. 11F, a new read request comes in for a <file handle, offset>, which is labeled as a duplicate in file index 1112. The cache manager sees that the duplicate entry has generation ID of 1, which matches the WEU generation ID kept in WEU Generation ID Table 1122. In another embodiment the WEU Generation ID could be kept in the WEU header instead. The cache manager then reads the data from WEU 3. The base <file handle, offset> in the extent header cannot be used for confirmation in this case, but since the generation ID is correct, the cache manager considers the data to be valid. The extent is then uncompressed and used to satisfy the read request.

Figure 11G:
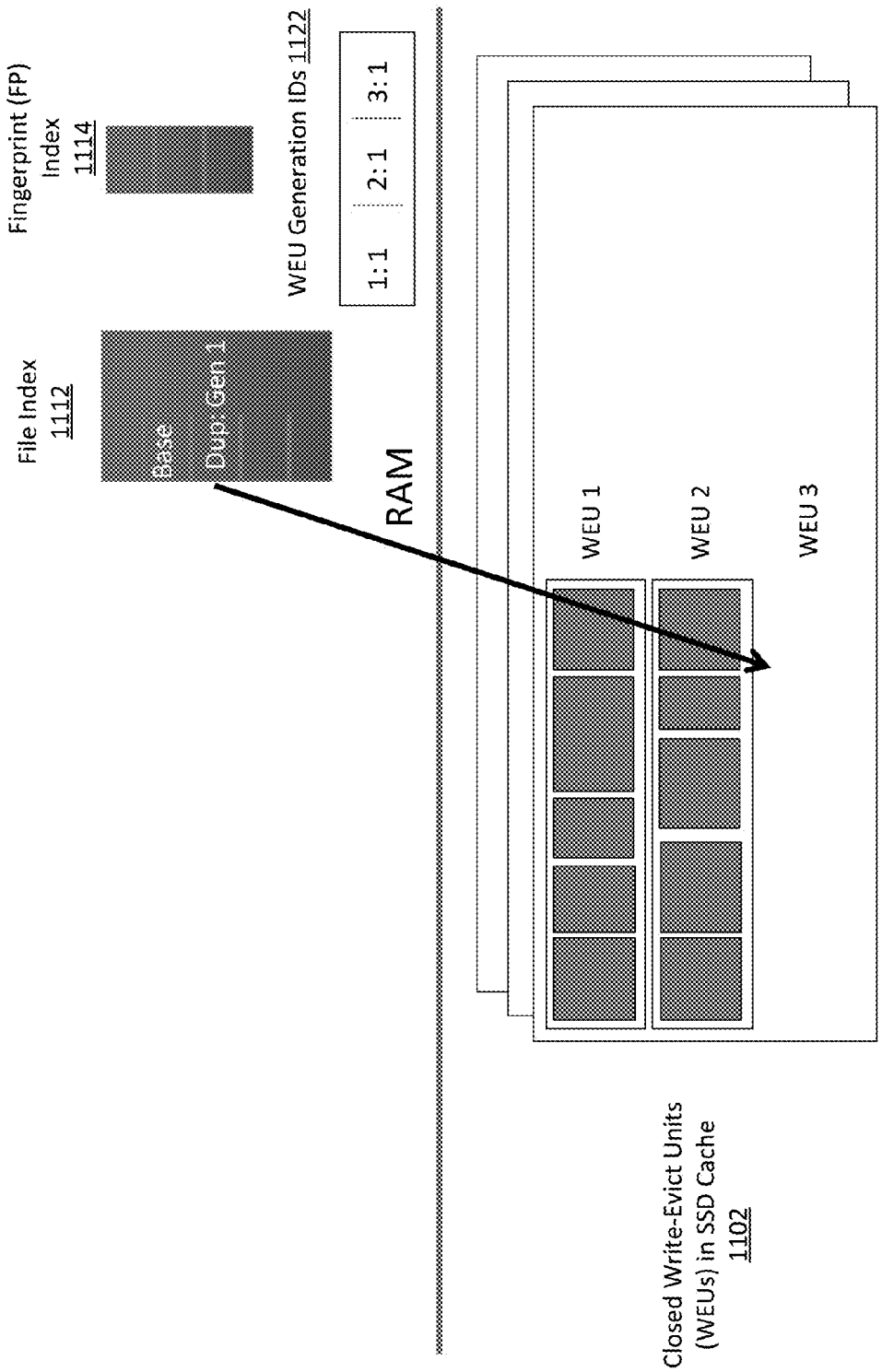

At FIG. 11G, time passes, and WEU 3 has been evicted to make room for another WEU that has been filled in RAM and needs to be written to the cache. When WEU 3 is evicted, the cache manager reads the extent headers and removes entries from the file index 1112 and fingerprint index 1114 for the extents being evicted. However, the duplicate entry within file index 1112 is not removed, because the extent header does not reference it.

Figure 11H:
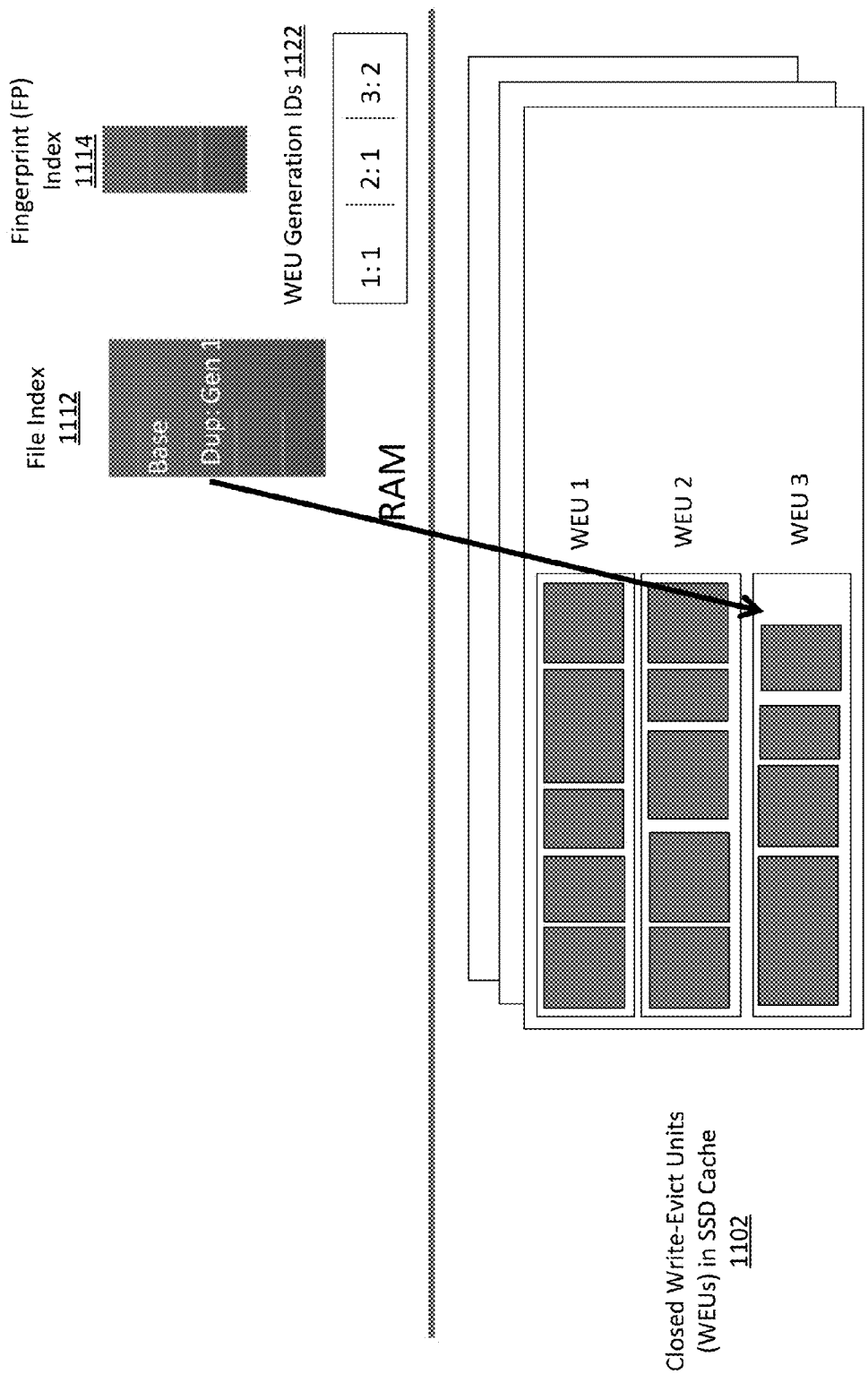

At FIG. 11H, another WEU is written to the cache and take the place of original WEU 3. Now the generation ID for WEU 3 is increased to value 2. If a read comes in for the duplicate entry, the cache manager checks the generation ID and finds that the generation ID of 1 in the duplicate entry is incorrect. The cache manager then removes the duplicate file index entry and responds that the cache does not contain the data.

Enhancement of Indexing Architecture in Deduplicate Cache System

A). Embodiments of Different Fingerprint Indices and Operations

As discussed herein above, a fingerprint index is referenced either to identify duplicate entries or to map from fingerprints to physical locations. The size of a fingerprint entry can be a few percent of the represented data (for example, a fingerprint of 40 bytes representing a compressed 4 kilobytes block of size 2 kilobytes). This kind of size ratio is still too large to allow efficiently storing the fingerprint index in memory, and fingerprints are spilled to a storage space such as disk or SSD storage. However, accessing fingerprints on disk is slow. Thus, embodiments of the invention implement several enhancements to keep the fingerprint index in memory.

In one embodiment, the fingerprint index is only used to identify duplicates but not to map file index entries to cache locations. It is the file index that directly references cache locations for both base and duplicate entries. A partial fingerprint index is used to reference only a subset of the data stored on the cache. The fingerprint index is only consulted to identify duplicate entries before writing new entries to the cache. Thus a partial fingerprint index does not impact the accessibility of data, only the deduplication ratio. (This is in contrast to a full fingerprint index in which the file index indirectly maps through the fingerprint index to find the cache location.)

In another embodiment, the fingerprint index is used both to identify duplicates and to map duplicate file index entries to the cache location. However, base file index entries are still directly mapped to the cache location. This still allows for having a partial fingerprint index. This is similar to the previous embodiment but it allows data to be more readily moved to a new location in the cache while only having to update one index entry. However it has the disadvantage that the fingerprints must remain in the fingerprint index while the data they reference is in the cache.

In another embodiment, an enhancement applies to post-process deduplication, in which case no fingerprint index is needed except when consolidating entries. All the inserted extents are written to the cache, and the cache is periodically traversed to identify duplicates and consolidate them into one location. Stale entries are then cleaned. The advantage is elimination of the fingerprint index but at the cost of higher erasures on the cache. Optionally, a full or partial index can be used to identify duplicates in real-time and consolidate them later.

B). Cache Deduplication Granularity Different from that of the File System

Deduplicated file systems typically have a deduplication granularity similar to the file block size. However, in order to reduce the memory footprint of the file index, a unit larger than the file block size can be used for insertion into and eviction from the cache. This can result in having a larger deduplication granularity than that of the underlying file system. To accommodate this requirement, the system may aggregate the smaller granularity fingerprints together to form a new fingerprint over the larger region. Alternatively, in another embodiment, the system has a fingerprint over the larger granularity that could be stored in the file system namespace or calculated as needed.

C). Utilizing Invalidation Bitmap

File blocks in the cache that are overwritten by a client must either be rewritten in the cache or marked as invalid. Small random overwrites in cache (such as one made of SSD) are expensive and dramatically increase wear. To avoid this, one embodiment of the invention keeps an in-memory bitmap that indicates which of the blocks in an extent are invalid. An embodiment of the invention utilizing an invalidation bitmap is discussed herein below.

D). Embodiments of Cleaning Stale Entries

A deduplicated cache requires special cleaning consideration. Unlike a primary storage (e.g., a disk storage), which only removes data due to a file deletion or update, cached entries can be evicted. Unlike file deletions or updates, which have information such as <file handle, offset> to refer to a file, when entries are evicted, there is no explicit reference to the index entry. In this case, back-pointers are needed to determine which index entries reference the evicted data. However, the back-pointers within the cache require frequent updates to the extent header to track duplicate references to the extent, which either increases cache churn or is size prohibitive if kept in memory. Instead, in one embodiment, a cleaning process is deployed to record evicted WEUs and periodically traverse the index entries removing ones that reference an evicted WEU based on generation number. In an alternative embodiment, invalid index entries are removed when they are accessed upon determining that the underlying data has been changed (as identified by a generation number as illustrated herein above). In another embodiment, the file index is separated into two indices, one for base entries and one for duplicate entries. The extent headers in the cache would have back-pointers to the base entries and cleaning would traverse the duplicate index only. In addition, as extents within WEUs become invalidated due to file overwrites, the system can clean mostly dead WEUs by copying forward valid blocks from cleaned WEUs and repacking them into new WEUs. Alternatively, valid blocks can simply be cleaned without getting copied forward to save wear.

E). Embodiments for System Restart

When a deduplicated cache system restarts after a standard shutdown or a crash, some of the data on the cache will be valid and some invalid. A scan of the cache is required to recreate the file index mapping and fingerprint index mapping to cache location using information such as <file handle, offset>. In the cache, a per-extent header would be kept that indicates which file <file handle, offset> corresponds to the data. In addition, the system journals the invalidation bitmaps to persistent storage. When recovering from a crash, the cache manager reads the WEU headers from the cache, which list the extents within a WEU. Each extent is checked against the invalidation list, and live extents (i.e., the extent has enough valid blocks are used to populate the file index and fingerprint index. The invalidation list can be released once the scan has completed.

F). Embodiment of Hash Entry Memory Optimization

In one embodiment, the file index illustrated in FIG. 7 is implemented as a hashtable. The <file handle, offset> (key) maps to a hash bucket via a hash function. More than one <file handle, offset> may map to the same hash bucket. In order to disambiguate entries, a second hash of the <file handle, offset> may be stored in the hashtable entry. Collisions on both hash functions could still occur, but at much less frequency, and can be detected by storing the <file handle, offset> in the extent header in the cache. When the extent is read, a cache manager validates that the <file handle, offset> in the header matches the request.

Figure 12:
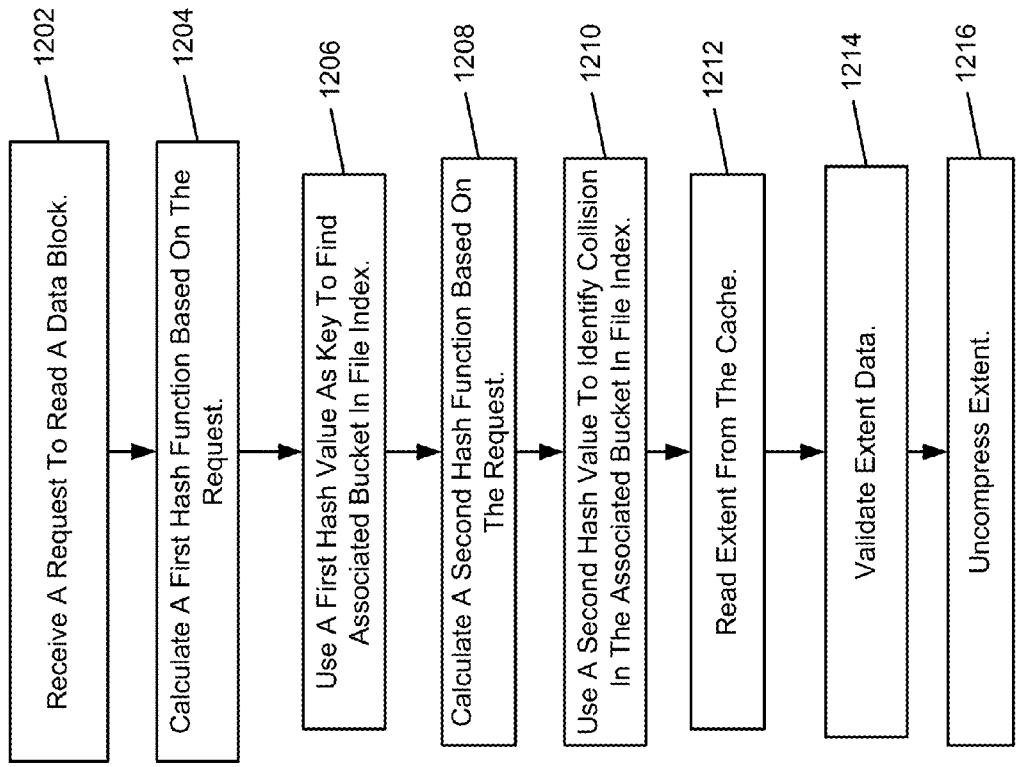
FIG. 12 is a flow diagram illustrating a process of reading request for a base entry utilizing hashtable optimization according to one embodiment of the invention.

FIG. 12 is a flow diagram illustrating a process of handling a read request for a base entry utilizing hashtable optimization according to one embodiment of the invention. The process may be performed by a cache manager 115 of FIG. 1.

Referring to FIG. 12, the process starts with receiving a read request at reference 1202. The read request identifies the data block to satisfy the request using a <file handle, offset> (or the data block for the request may be identified in a different way discussed herein above). At reference 1204, a first hash function based on the request is calculated, for example, using the <file handle, offset>. Then a cache manager uses a first hash value as a key to find an associated bucket in a file index of the system at reference 1206. At reference 1208, a second, alternate hash function (for example a hash function similar to the first hash function but using different prime numbers for the hash calculation) is calculated using the <file handle, offset>. The resulting second hash value is used to reconcile collisions in the associated bucket in the file index at reference 1210. Then the cache manager reads an extent from the cache based on the file index at reference 1212. The cache manager validates the extent data at reference 1214 and then the extent is uncompressed and replied to the read request at reference 1216. A validation failure means that the <file handle, offset> in the extent header fails to match the <file handle, offset> of the request.

Figure 13:
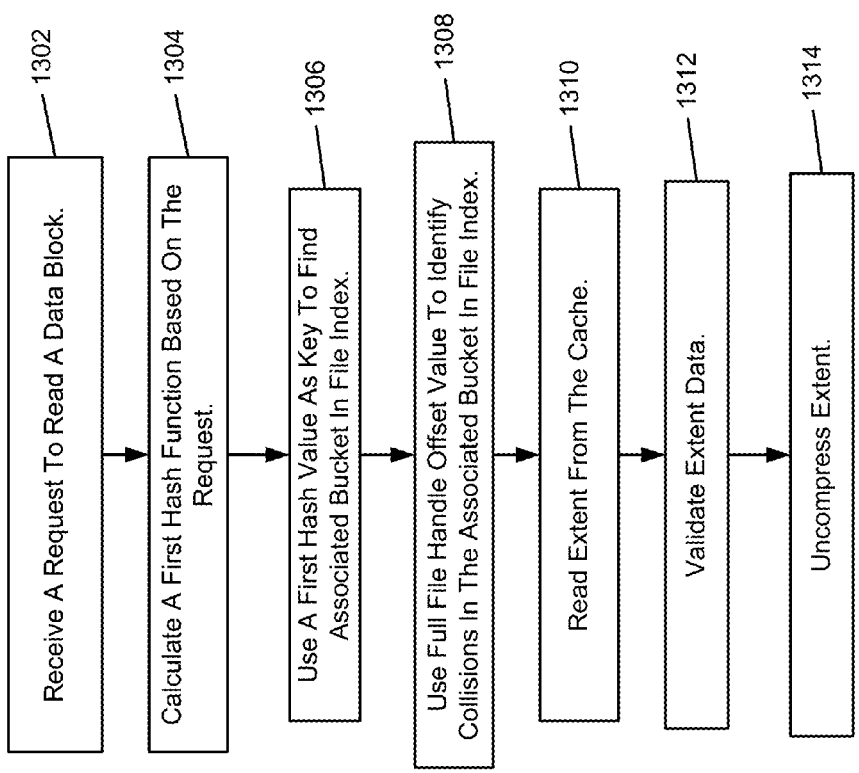
FIG. 13 is a flow diagram illustrating a process of reading request for a duplicate entry utilizing hashtable optimization according to one embodiment of the invention.

FIG. 13 is a flow diagram illustrating a process of satisfying a read request for a duplicate entry utilizing hashtable optimization according to one embodiment of the invention. The process may be performed by a cache manager 115 of FIG. 1. The work flow of FIG. 13 is similar to that of FIG. 12, thus only the different steps are discussed. Referring to FIG. 13, after the first hash value is used as a key to find an associated bucket in the file index, for the duplicate entry, a full <file handle, offset> value is used to identify collisions in the associated bucket in the file index at reference 1308.

Figure 14:
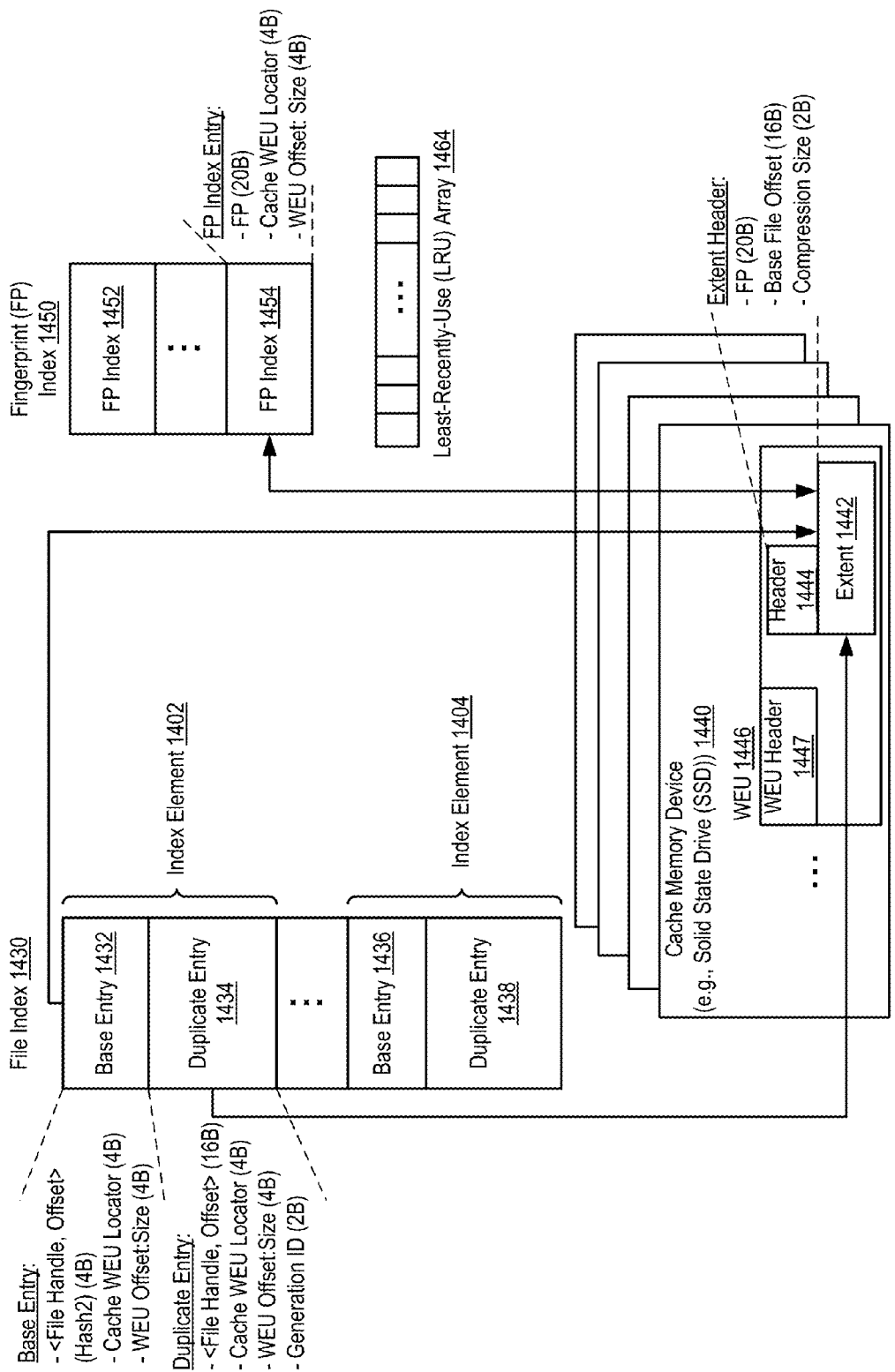
FIG. 14 illustrates an indexing architecture utilizing hashing in a deduplicated cache system according to one embodiment of the invention.

FIG. 14 illustrates an indexing architecture utilizing hashing in a deduplicated cache system according to one embodiment of the invention. FIG. 14 is similar to FIG. 7A, and same or similar references indicate elements or components having the same or similar functionalities. Note in the base entry in file index 1430, the <file handle, offset> is only 4 bytes, while in an implementation without hashing (for example, the format of base entry illustrated in FIG. 8A) is much longer. Thus, implementation utilizing hashing saves space for the file index at a deduplicated cache system.

Utilizing Existing Index in Deduplicate Cache System

For a primary storage, duplication exists mostly in snapshots, Virtual Machine Disks (e.g., VMDKs, VHDs, etc.), and files with large extents of similarity. Thus, a large percentage of deduplication can be achieved with a course grained chunking (e.g., 128 kilobytes). Some deduplication systems are already utilizing a Merkle tree tracking coarse grained duplication, and the existing fingerprints in the memory can be leveraged to identify duplicate regions in a cache.

Figure 15A:
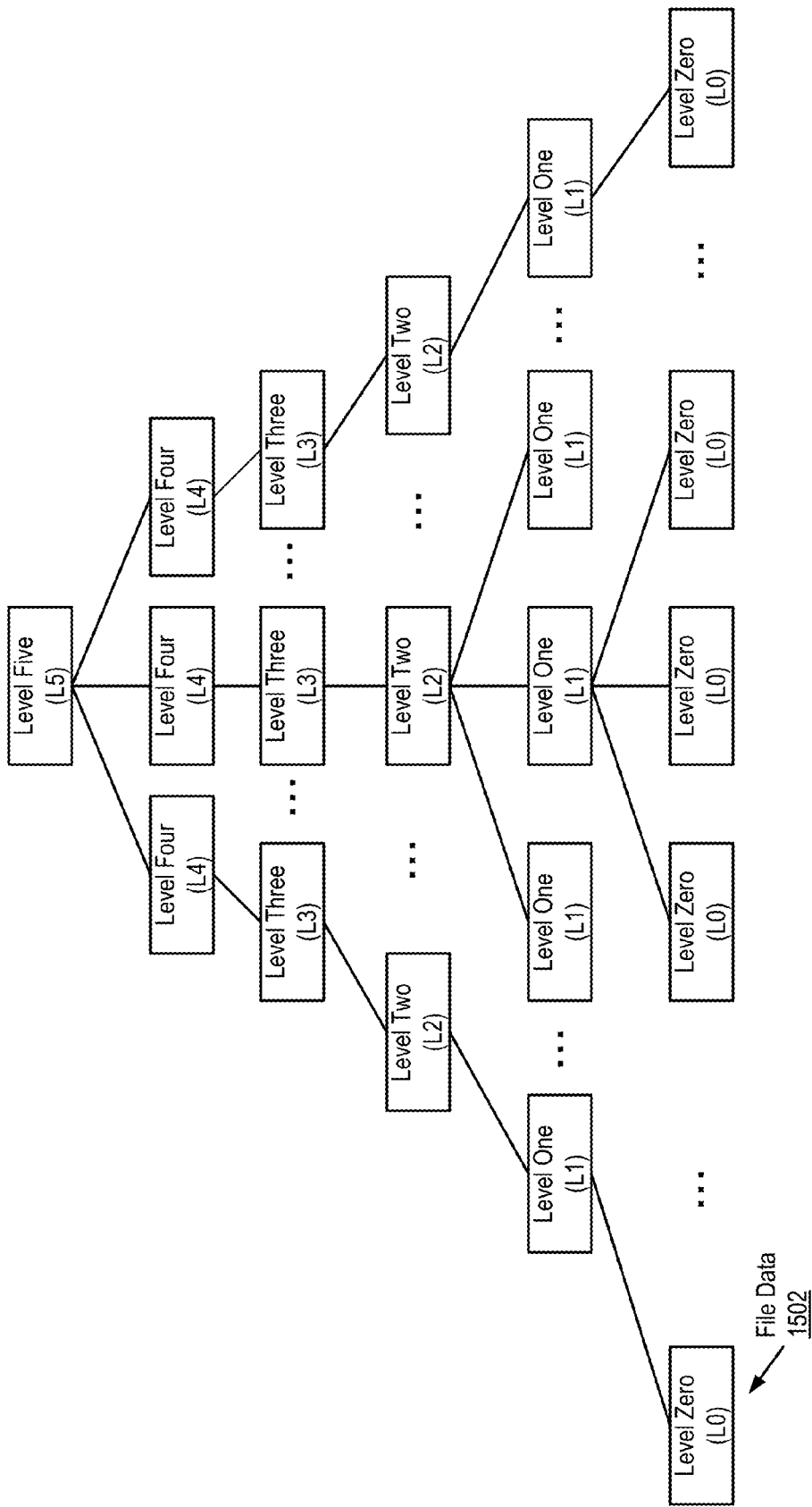
FIGS. 15A-B illustrates alternative segment trees according to embodiments of the invention.

FIG. 15A illustrates a segment tree utilized in a deduplicating storage system according to one embodiment of the invention. Often the segment tree utilized in a deduplicating storage system is referred to as LP segment tree. The "L" in LP refers to the level of the tree, and The "P" is 5 for the root of the tree, 4 for the nodes below the root node, and so on. The LP segment tree is a Merkle tree representing a file. In this embodiment, the Merkle tree has six levels, where the bottom level, level zero (L0), contains file data. Each parent level spans 512 children. The parent references a child by the fingerprint of the child segment. Each node spans a fixed or variable sized amount of data. In order to locate the data for a specific offset in the file, one may traverse the Merkle tree based on the node size covered to the leaf node for that offset.

Figure 15B:
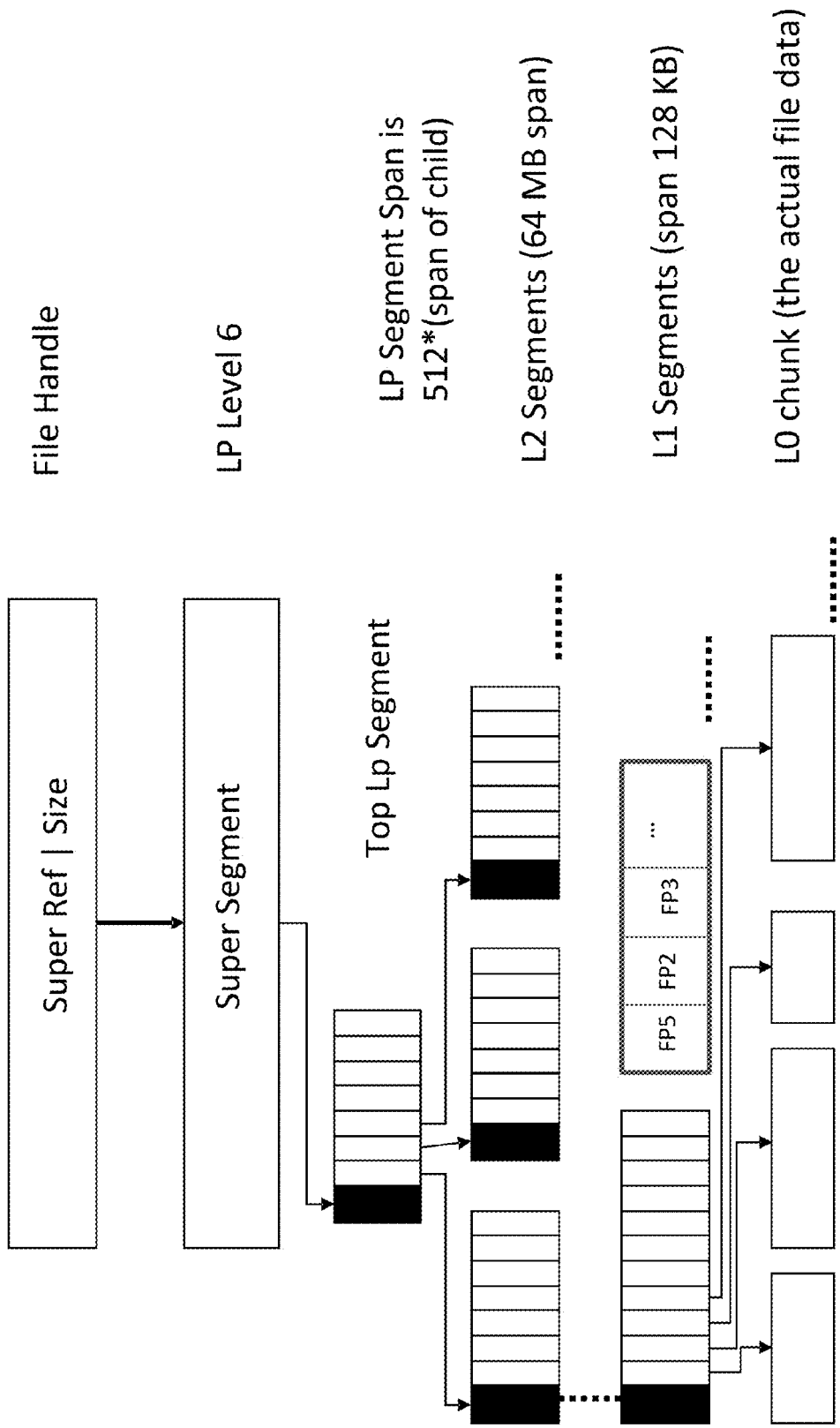

FIG. 15B illustrates an alternate segment tree utilized in a deduplicating storage system according to one embodiment of the invention. Referring to FIG. 15B, the underlying storage system stores file data chunks at L0, and L1 segments (spanning 128 kilobytes in this embodiment) contain fingerprints of the L0 chunks. Similarly, L2 segments contain fingerprints of L1 segments, and the chains of fingerprints move upward to the top of the Merkle tree.

LP fingerprints may be stored in the memory; for example, recipe cache 224 of FIG. 2 may store the LP fingerprints. With the LP fingerprints in the memory, we may use some level of the fingerprint (e.g., L1, L2, or other levels) without building a separate fingerprint index in the memory as illustrated in FIG. 7.

Figure 16:
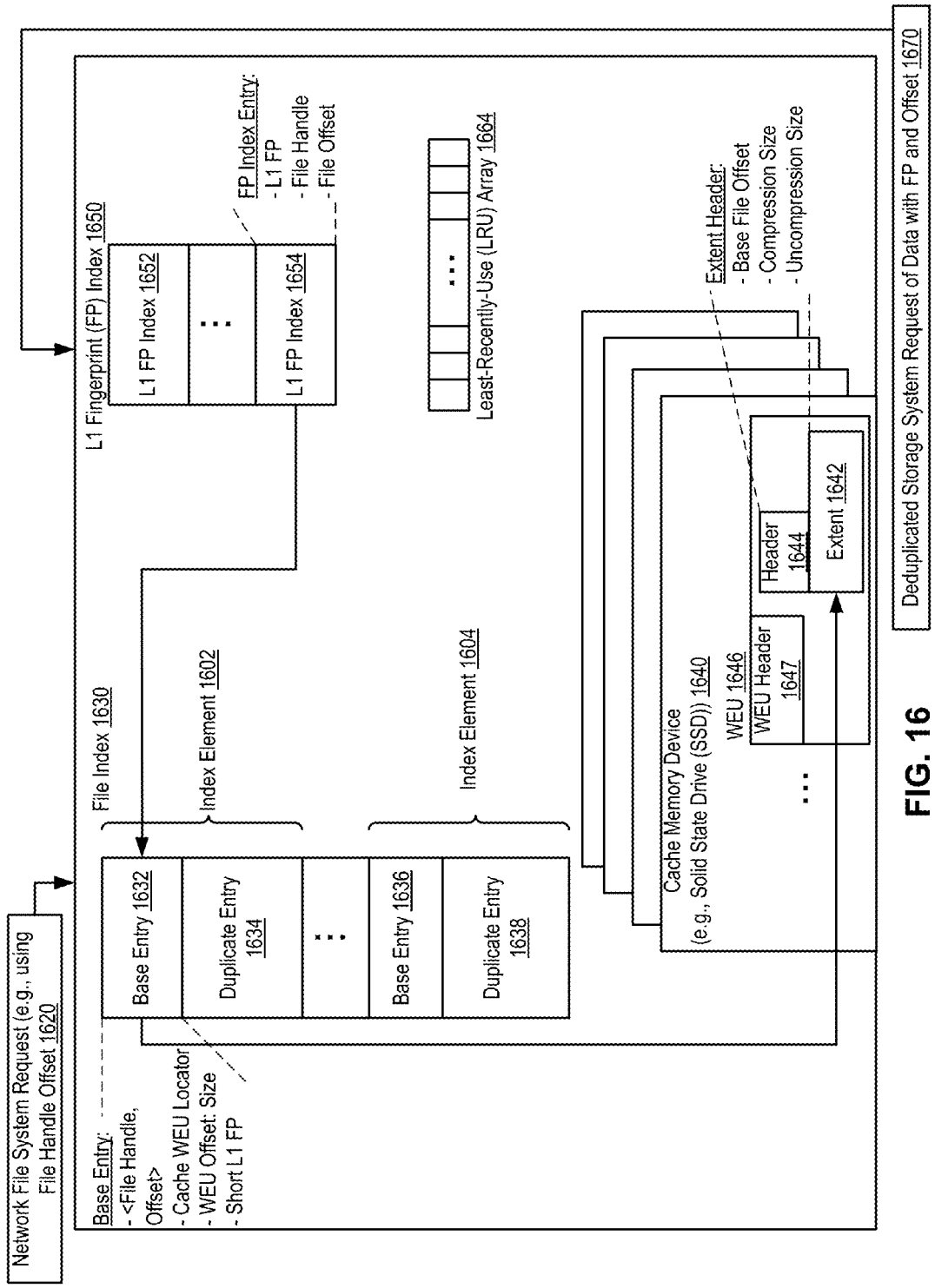
FIG. 16 illustrates a deduplicated cache system utilizing LP indexing according to one embodiment of the invention.

FIG. 16 illustrates a deduplicated cache system utilizing LP indexing according to one embodiment of the invention. FIG. 16 is similar to FIG. 7 and the same or similar references indicate elements or components having the same or similar functionalities. One difference between the figures is that L1 fingerprint index 1650 in FIG. 16 takes the place of fingerprint index 750 in FIG. 7. L1 fingerprint index 1650 stores L1 fingerprints in the memory for deduplication of the cache system and deduplicates at the data size covered by an L1 entry rather than an extent size. Advantages of using an L1 fingerprint index include deduplicating at a coarser granularity, using the LP fingerprints already in the underlying system and likely cached in recipe cache 224 of FIG. 2.

Cache 1640 has two new query interfaces. A read request from a user may first come from reference 1620. The request contains a <file handle, offset> indicating the location of the requested data block within the file in one embodiment. The cache manager checks file index 1630 associated with the cache based on the user read request. If a matching entry is found within the file index, the cache manager reads an extent from the cache, validates the extent data, and replies to the request.

If a matching entry is not found within the file index, the system will traverse the Merkle tree of LP segments of the underlying deduplicating storage system until it finds the L1 segment covering the requested data. It sends a request of data with the fingerprint and offset at reference 1670 to see if some or all of the data covered by the L1 segment are in the cache. In one embodiment, the checking goes through lower file system layers. If a L1 fingerprint match is found within L1 FP index 1650, then that entry will indicate a <file handle, offset> which maps to the covered data. The corresponding data can then be read from cache and returned to satisfy the read request (in some embodiments the presence of an L1 fingerprint entry in the cache only indicates that some of its associated data is stored in the cache). An entry can be added to file index 1630 associating the new <file handle, offset> request with the cached data of the L1 fingerprint.

Note L1 fingerprint index can be a partial index and not every data entry in the cache needs to have a L1 entry. In one embodiment of the invention, a different level of fingerprint index (such as L2) or multiple levels may be utilized. Also note that LP fingerprint index can have entries from different levels of the segment tree and there may be multiple LP fingerprint indices in one deduplicated cache system.

Insertion and Eviction of Index Entries

As discussed herein above, a fingerprint index may not contain entries for all the data. A deduplicated cache system may implement a variety of ways to decide what to populate in a fingerprint index. One way is to profile characteristics of data and the storage system. A client may specify that certain storage volumes are likely to have duplicates, and fingerprints of data in those storage volumes should have a higher priority of being index entries in the fingerprint index. For example, a system knows which files are parts of a primary storage system versus part of snapshots/backups. When accessing both the primary version and a snapshot/backup these files should take a higher priority in having the fingerprints of their data get entries in the fingerprint index. Similarly virtual machine disk images are more likely to share duplicate data and may be given higher priority for adding entries to these into the fingerprint index.

The system may also profile the data through sampling. For example, a system may keep a small set of fingerprints in memory per volume. If the system determines one volume has more duplicates then another, deduplication can be turned on for the former volume.

For a given size of fingerprint index (full index or partial index), to insert a new entry, a current entry needs to be evicted. A system may evict the least-recently-used (LRU) entry in the fingerprint index, or other eviction algorithms may be used. Embodiments of the invention utilize an enhancement of the LRU based mechanism.

Figure 17A:
FIGS. 17A-B illustrate the operations of an enhanced LRU eviction mechanism according to one embodiment of the invention.
Figure 17B:
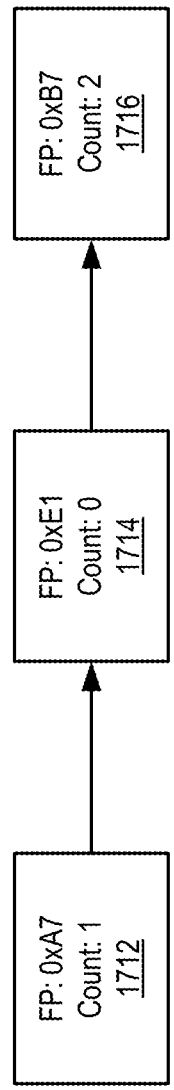

FIGS. 17A-B illustrate the operations of an enhanced LRU eviction mechanism according to one embodiment of the invention. FIG. 17A illustrates a simple fingerprint index containing three entries. The fingerprint at the left most entry of reference 1702 is the most-recently-used (MRU) entry while the fingerprint at the right most entry of reference 1706 is the LRU entry. Each entry in the fingerprint index maintains a count, which counts the number of duplicate file index entries. Here the entries 1702-1706 have counts 1, 0, and 0 respectively. When a new fingerprint index entry needs to be added, the cache manager checks the LRU entry, which is evicted since the LRU entry at reference 1706 has no duplicate.

FIG. 17B illustrates the same fingerprint index containing the three entries. The difference is that the entries 1712-1716 have counts 1, 0, and 2 respectively. When adding a new entry, the last entry is temporarily removed, and its count is decremented by one, and it is then reinserted at the head of the cache and becomes the most recently used (MRU) entry. The entry with the lowest duplicate count at reference 1714 is then evicted.

Figure 18:
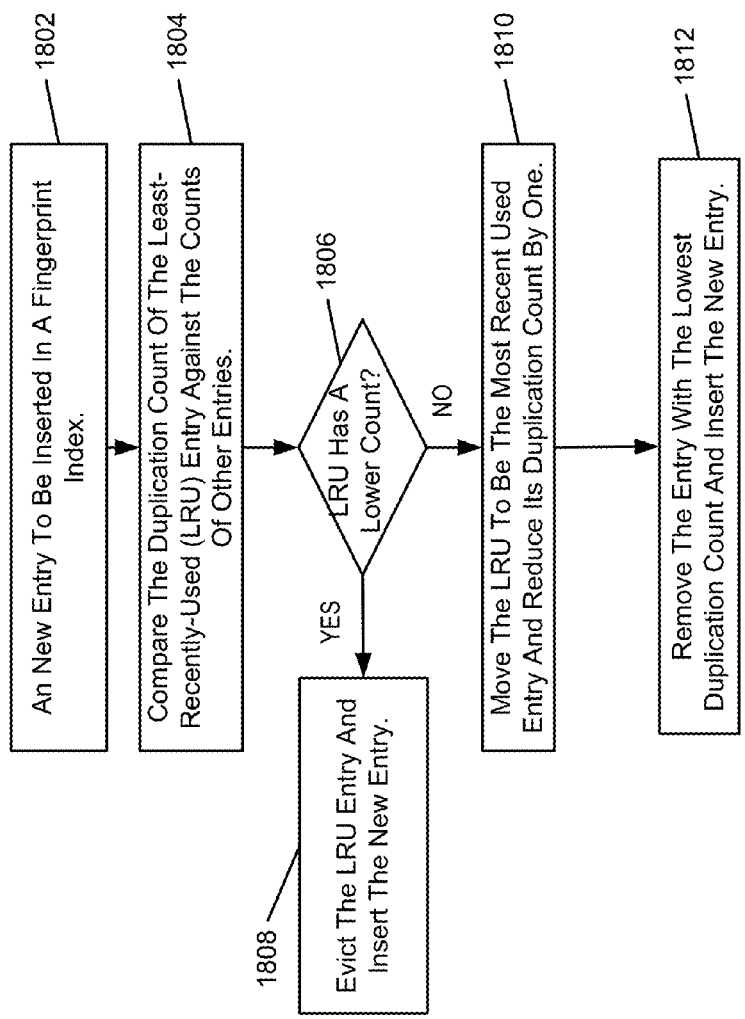
FIG. 18 is a flow diagram illustrating the operations of an enhancement LRU eviction mechanism according to one embodiment of the invention.

FIG. 18 is a flow diagram illustrating the operations of an enhanced LRU eviction mechanism according to one embodiment of the invention. The operations may be performed at cache manager 115 of FIG. 1.

Referring to FIG. 18, the method starts with a new entry to be inserted in a fingerprint index of a deduplicated cache system at reference 1802. The cache manager will compare the duplication count of the least-recently-used entry (LRU) entry against the count of the entry next to it (the second least recently used entry) at reference 1804. At reference 1806, it is determined whether or not the LRU entry has the lower duplicate count. If it has the lower duplicate count, the entry is evicted, and the new entry is inserted as the MRU entry. If the LRU entry does not have the lower duplicate count, it is removed from its present position in the queue and reinserted at the top of the LRU queue, and the second least recently used entry is removed instead. That is, an entry having a combination of the oldest access time and least duplicated references (e.g., counts) will be considered as a top candidate for eviction. It should be understood that the described eviction policy is one embodiment and other embodiments are possible that use a combination of access time and duplicate count (with various weights) when making eviction decisions.

Insertion and Eviction of Data in Cache

Figure 19:
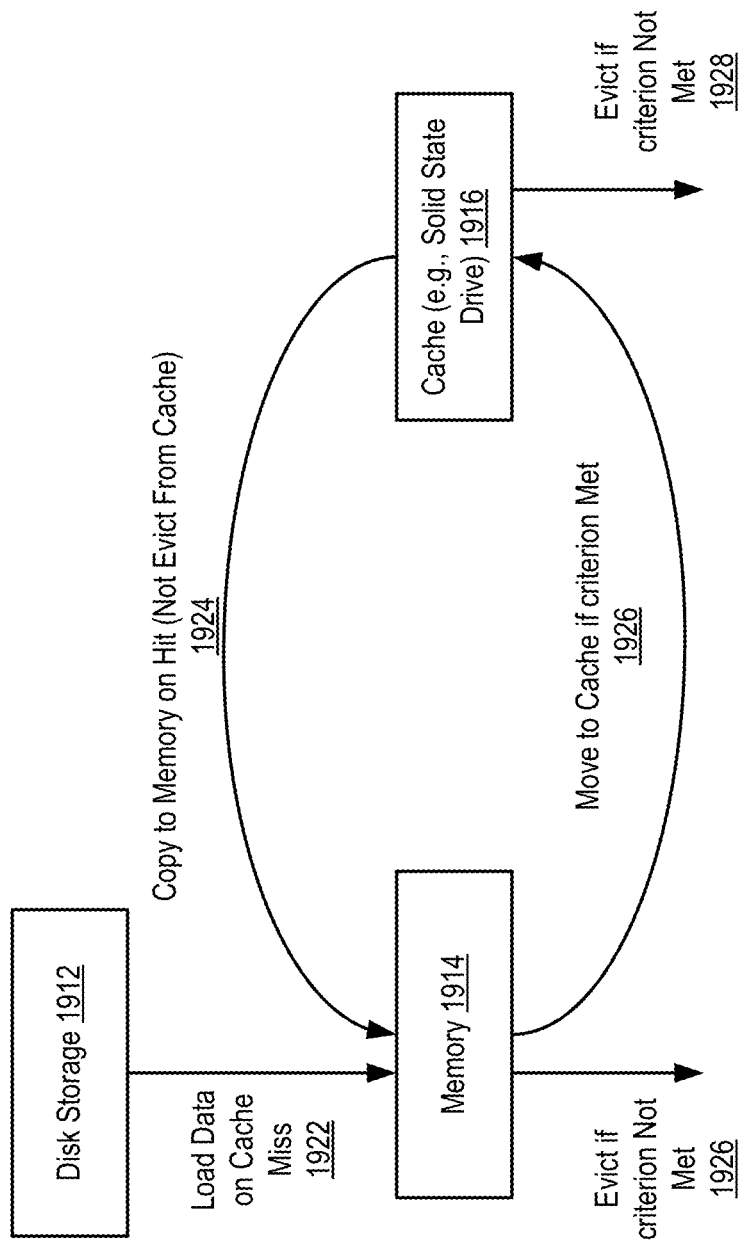
FIG. 19 illustrates the insertion and eviction of data in a deduplicated cache system according to one embodiment of the invention.

In a cache, there is flexibility in what is inserted. Evicting useful data can result in a performance penalty similar to failing to insert something that would have been useful. The performance penalty from not caching the "best" data stems from guessing wrong, but it does not affect correctness. FIG. 19 illustrates the insertion and eviction of data in a deduplicated cache system according to one embodiment of the invention. The deduplicated cache system contains disk storage 1912, memory 1914, and cache 1916.

Data is loaded from disk storage 1912 to memory 1914 upon cache miss at reference 1922. When no longer required in memory 1914, the data is moved to cache 1916 if a certain criterion is met. If the criterion is not met, the data is evicted from memory 1914 and not cached in cache 1916. At cache 1916, the data is copied to memory 1914 if there is a hit at reference 1924. At some later time, data may be evicted from cache 1916 if a certain criterion is not met.

The criteria of insertion are numerous. For example, one or more criteria may be utilized for the insertion decision:

Access pattern: Caching a large sequential I/O should be avoided as the reuse hit rate may be low;

File "hotness": The cache may require repeated accesses to a file extent over a certain threshold prior to insertion;

Fragmentation: Insertion should be skipped if garbage collection is not keeping up with the arrival of data for insertion;

Quality of service (QoS) requirement: Some data streams have QoS requirements and should have a higher priority in the cache insertion decision;

Memory pressure: The fullness of the cache with other presumably useful data should be considered;

Likelihood of rereading: If the system knows some data will be read again (e.g., hints at the application level), those data needs to be given a higher priority; and Churn of a cache made of solid-state device (SSD) (or other flash-based devices): For a SSD cache, the insertion decision may be adjusted based on the level of recent churn in the SSD cache.

Similar to insertion decisions, the access of data can be accelerated by pre-fetching. Pre-fetching is useful when reading sequential data so that the later data is available, which allows for more efficient reads. The pre-fetching criteria is similar to insertion, and the degree of pre-fetch can be varied based on performance (e.g., whether or not the disk storage is keeping up with pre-fetch requests) and past history (e.g., whether pre-fetched data has been used).

Exclusion List

A cache using SSD has its challenges. For example, a smaller unit of insertion (e.g., 4 kilobytes) requires finer grained indexing which will result in more precise matching, but it will also results in larger memory requirements. A larger unit of insertion (e.g., 32 kilobytes) has coarser indexing and will result in lower memory requirements but higher SSD churn (as sub-regions of the larger unit can become either invalidated, over-written or never used). As we discussed above, a SSD wears out over a certain number of writes, so it is desirable to limit SSD churn.

Figure 20:
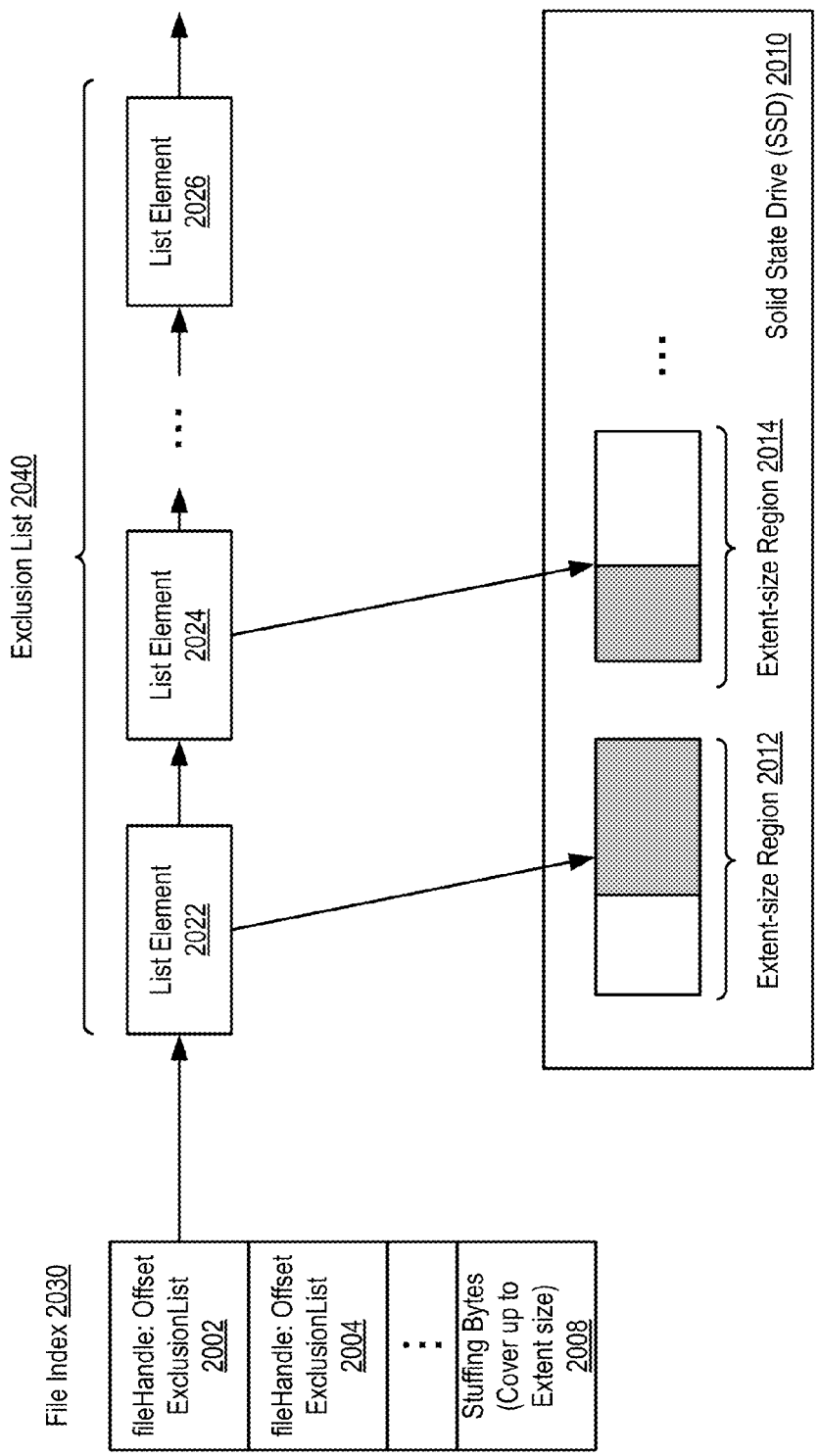
FIG. 20 illustrates an indexing architecture utilizing exclusion lists in a deduplicated cache system according to one embodiment of the invention.

One approach is to utilize a data structure called an exclusion list. FIG. 20 illustrates an indexing architecture utilizing exclusion lists in a deduplicated cache system according to one embodiment of the invention. The deduplicated cache system contains a file index 2030, each entry of the file index is anchored by a <file handle, offset>, and each entry points to an exclusion list such as exclusion list 2040. The file index entry 2002 points to exclusion list 2040, which contains a number of list elements or nodes 2022-2026. Each list element points to a region in SSD cache 2010, where the region size is equal to or less than an extent size. Regions 2012 and 2014 contain different white areas and grayed-out areas, which designate valid and invalid data blocks within the extent region as detailed in FIG. 21.

Figure 21:
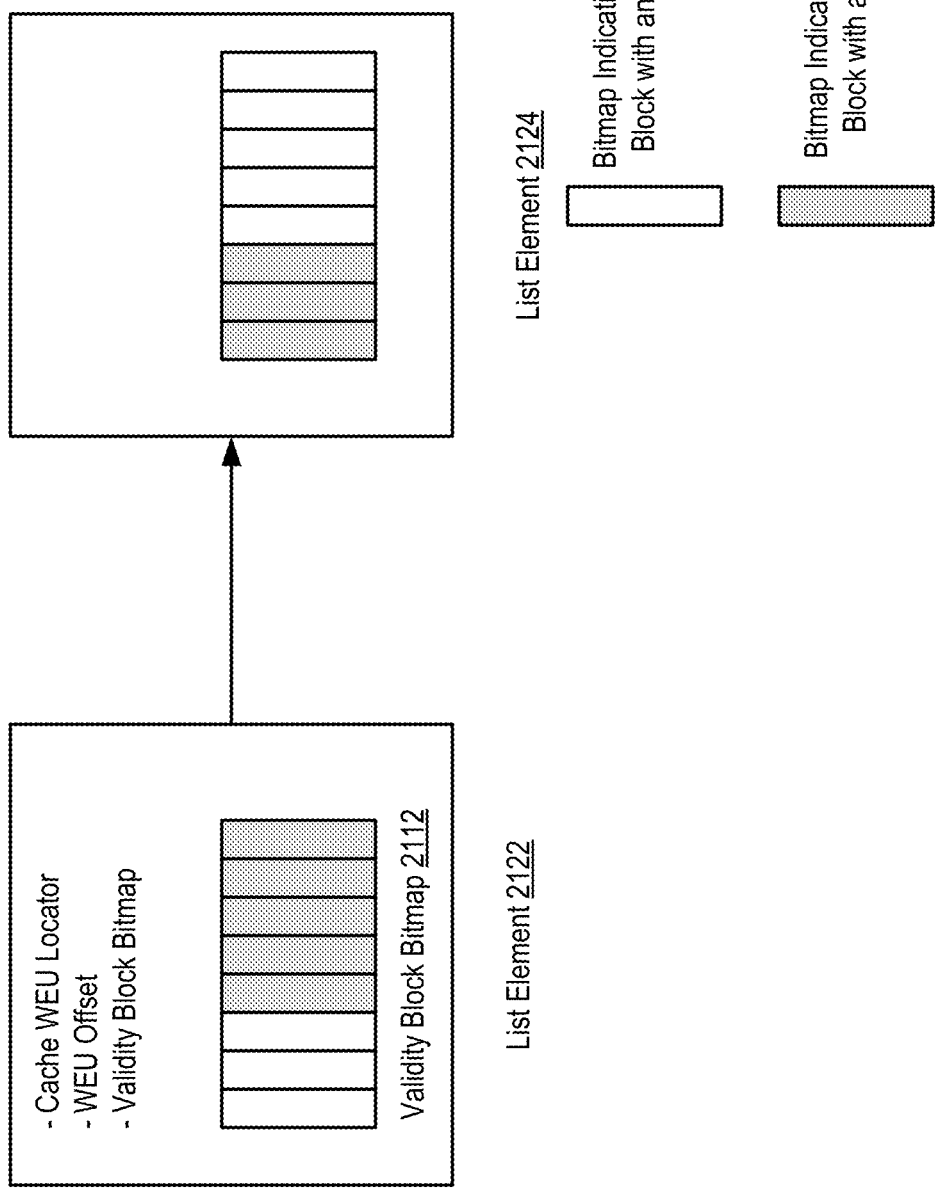
FIG. 21 illustrates list elements within an exclusion list according one embodiment of the invention.

FIG. 21 illustrates list elements within an exclusion list according one embodiment of the invention. As illustrated, each list element contains a cache WEU locator to indicate the WEU the list element points to, a WEU offset indicating a particular extent within the WEU, and a validity block bitmap. The validity block bitmap indicates the validity of blocks within an extent. For example, an extent of 32 KB may be divided into eight blocks of 4 KB each. Validity block bitmap 2112 indicates that blocks 0-2 are valid while blocks 3-7 are either invalid or not present in the cached region.

With validity block bitmaps, an exclusion list may indicate which parts of extents are valid and thus can be read for data access and which are not valid or not present. The valid block bitmaps are updated as data are overwritten in the cache. Thus, even though a list element points to the same SSD in the cache, its bitmap can be updated to indicate invalidated blocks within the extent. This can help reduce SSD churn by reducing the amount of cleaning (copying forward and consolidating of live data) that must be done. The validity bitmap can be journaled to persistent storage so that it is available when the system restarts either from a normal shutdown or from a system crash.

Figure 22:
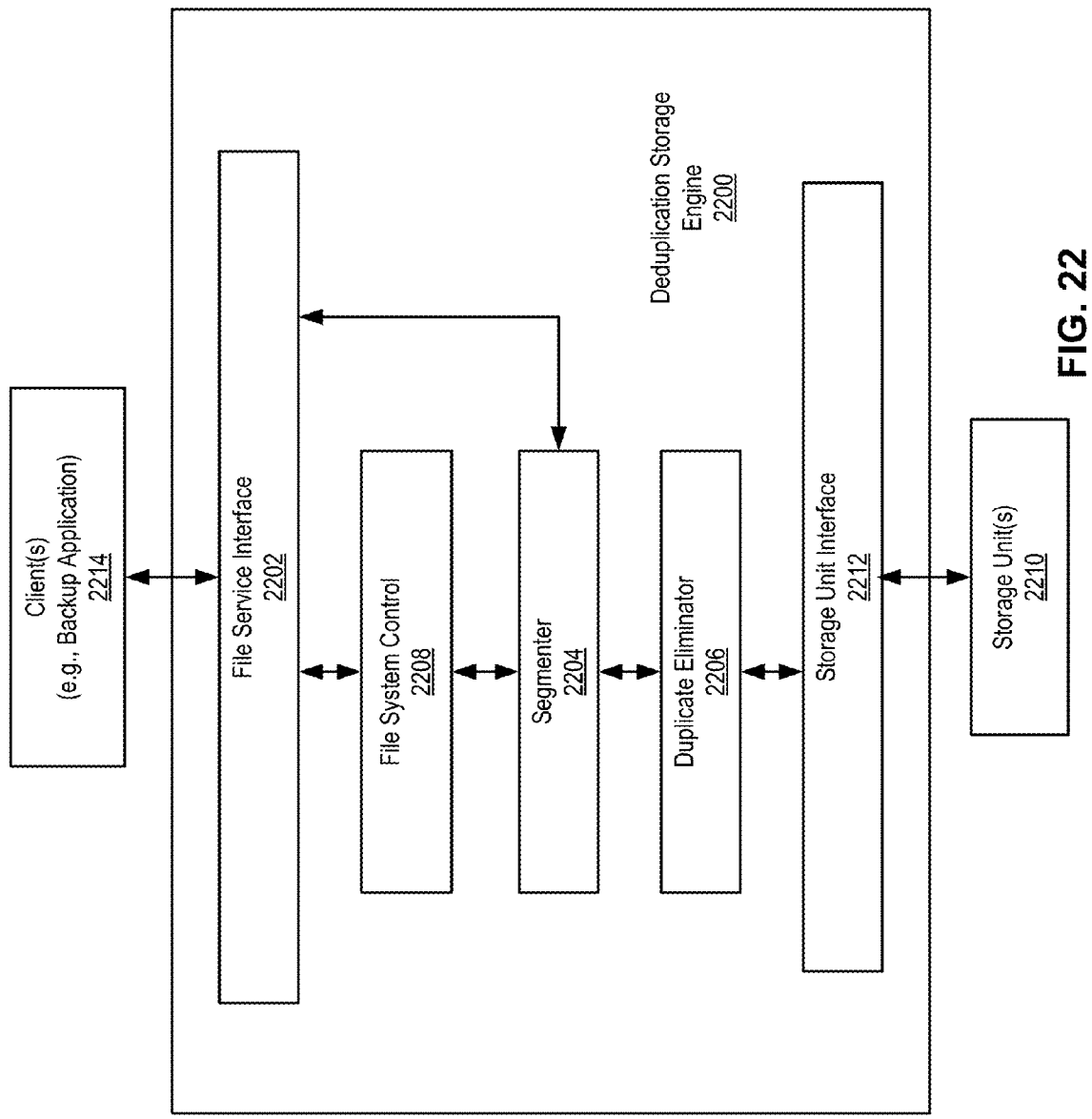
FIG. 22 is a block diagram illustrating a deduplicated storage system according to one embodiment of the invention.

FIG. 22 is a block diagram illustrating a deduplication storage system according to one embodiment of the invention. For example, deduplication storage system 2200 may be implemented as part of a deduplication storage system as described above, such as, for example, the deduplication storage system as a client and/or a server as shown in FIG. 1. In one embodiment, storage system 2200 may represent a file server (e.g., an appliance used to provide network attached storage (NAS) capability), a block-based storage server (e.g., used to provide storage area network (SAN) capability), a unified storage device (e.g., one which combines NAS and SAN capabilities), a near-line storage device, a direct attached storage (DAS) device, a tape backup device, or essentially any other type of data storage device. Storage system 2200 may have a distributed architecture, or all of its components may be integrated into a single unit. Storage system 2200 may be implemented as part of an archive and/or backup system such as a deduplicating storage system available from EMC® Corporation of Hopkinton, Mass.

In one embodiment, storage system 2200 includes a deduplication engine 2201 interfacing one or more clients 2214 with one or more storage units 2210 storing metadata 2216 and data objects 2218. Clients 2214 may be any kinds of clients, such as, for example, a client application, backup software, or a garbage collector, located locally or remotely over a network. A network may be any type of networks such as a local area network (LAN), a wide area network (WAN) such as the Internet, a corporate intranet, a metropolitan area network (MAN), a storage area network (SAN), a bus, or a combination thereof, wired and/or wireless.

Storage devices or units 2210 may be implemented locally (e.g., single node operating environment) or remotely (e.g., multi-node operating environment) via an interconnect, which may be a bus and/or a network (e.g., a storage network). In one embodiment, one of storage units 2210 operates as an active storage to receive and store external or fresh user data from a client (e.g., an end-user client or a primary storage system associated with one or more end-user clients), while the another one of storage units 2210 operates as a target storage unit to periodically archive data from the active storage unit according to an archiving policy or scheme. Storage units 2210 may be, for example, conventional magnetic disks, optical disks such as CD-ROM or DVD based storage, magnetic tape storage, magneto-optical (MO) storage media, solid state disks, flash memory based devices, or any other type of non-volatile storage devices suitable for storing large volumes of data. Storage units 2210 may also be combinations of such devices. In the case of disk storage media, the storage units 2210 may be organized into one or more volumes of redundant array of inexpensive disks (RAID). Data stored in the storage units may be stored in a compressed form (e.g., lossless compression: HUFFMAN coding, LEMPEL-ZIV WELCH coding; delta encoding: a reference to a chunk plus a difference; etc.). In one embodiment, different storage units may use different compression methods (e.g., main or active storage unit from other storage units, one storage unit from another storage unit, etc.).

The metadata, such as metadata 2216, may be stored in at least some of storage units 2210, such that files can be accessed independent of another storage unit. Metadata of each storage unit includes enough information to provide access to the files it contains. In one embodiment, metadata may include fingerprints contained within data objects 2218, where a data object may represent a data chunk, a compression region (CR) of one or more data chunks, or a container of one or more CRs. Fingerprints are mapped to a particular data object via metadata 2216, enabling the system to identify the location of the data object containing a data chunk represented by a particular fingerprint. A fingerprint may be generated based on at least a portion of a data chunk, for example, by applying a predetermined mathematical algorithm (e.g., hash function) to at least a portion of the content of the data chunk. When an active storage unit fails, metadata contained in another storage unit may be utilized to recover the active storage unit. When one storage unit is unavailable (e.g., the storage unit has failed, or is being upgraded, etc.), the system remains up to provide access to any file not stored in the failed storage unit. When a file is deleted, the metadata associated with the files in the system is updated to reflect that the file has been deleted.

In one embodiment, metadata 2216 may include a file name, a storage unit identifier (ID) identifying a storage unit in which the chunks associated with the file name are stored, reconstruction information for the file using the chunks, and any other appropriate metadata information. Metadata 2216 may further include a chunk ID, a chunk sketch, a hash of a chunk, an encrypted hash of a chunk, random data, or any other appropriate metadata. In some embodiments, metadata associated with a chunk is used to identify identical and/or similar data segments. The stored metadata enables a faster identification of identical and/or similar data chunks as an ID and/or sketch (e.g., a set of values characterizing the chunk) do not need to be recomputed for the evaluation of a given incoming data segment.

In one embodiment, a chunk ID includes one or more deterministic functions of a data chunk, one or more hash functions of a data chunk, random data, or any other appropriate data chunk ID. In various embodiments, a data chunk sketch includes one or more deterministic functions of a data chunk, one or more hash functions of a data chunk, one or more functions that return the same or similar value for the same or similar data chunks (e.g., a function that probably or likely returns a same value for a similar data segment), or any other appropriate data segment sketch. In various embodiments, sketch function values are determined to be similar using one or more of the following methods: numeric difference, hamming difference, locality-sensitive hashing, nearest-neighbor-search, other statistical methods, or any other appropriate methods of determining similarity. In one embodiment, sketch data includes one or more data patterns characterizing a chunk. For example, a sketch may be generated by applying one or more functions (e.g., hash functions) on a chunk and a subset of the results of the functions performed on the chunk (e.g., a number of results, for example the ten lowest results or the ten highest results) are selected as a sketch.

In one embodiment, a copy of the metadata is stored on a storage unit for files stored on a storage unit so that files that are stored on the storage unit can be accessed using only the information stored on the storage unit. In one embodiment, a main set of metadata information can be reconstructed by using information of other storage units associated with the storage system in the event that the main metadata is lost, corrupted, damaged, etc. Metadata for a storage unit can be reconstructed using metadata information stored on a main storage unit or other storage unit (e.g., replica storage unit). Metadata information further includes index information (e.g., location information for chunks in storage units, identifying specific data objects).

In one embodiment, deduplication storage engine 2201 includes file service interface 2202, segmenter 2204, duplicate eliminator 2206, file system control 2208, and storage unit interface 2212. Deduplication storage engine 2201 receives a file or files (or data item(s)) via file service interface 2202, which may be part of a file system namespace 2220 of a file system associated with the deduplication storage engine 2201. The file system namespace 2220 refers to the way files are identified and organized in the system. An example is to organize the files hierarchically into directories or folders, which may be managed by directory manager 2222. File service interface 2212 supports a variety of protocols, including a network file system (NFS), a common Internet file system (CIFS), and a virtual tape library interface (VTL), etc.

The file(s) is/are processed by segmenter 2204 and file system control 2208. Segmenter 2204, also referred to as a content store, breaks the file(s) into variable-length chunks based on a variety of rules or considerations. For example, the file(s) may be broken into chunks by identifying chunk boundaries. Chunk boundaries may be determined using file boundaries, directory boundaries, byte counts, content-based boundaries (e.g., when a hash of data in a window is equal to a value), or any other appropriate method of determining a boundary. Reconstruction of a data block, data stream, file, or directory includes using one or more references to the one or more chunks that originally made up a data block, data stream, file, or directory that was/were previously stored.

In some embodiments, chunks are segmented by identifying chunk boundaries that are content-based—for example, a hash function is applied to values of data within a sliding window through the data stream or block and when the hash function is equal to a value (or equal to one of several values) then a chunk boundary is identified. In various embodiments, chunk boundaries are identified using content based functions operating on windows within a data stream or block that have a minimum or maximum or other value or any other appropriate content based chunking algorithm. In various embodiments, chunks include fixed-length chunks, variable length chunks, overlapping chunks, non-overlapping chunks, chunks with a minimum size, chunks with a maximum size, or any other appropriate chunks. In various embodiments, chunks include files, groups of files, directories, a portion of a file, a portion of a data stream with one or more boundaries unrelated to file and/or directory boundaries, or any other appropriate chunk.

In one embodiment, file system control 2208, also referred to as a file system manager, processes information to indicate the chunk(s) association with a file. In some embodiments, a list of fingerprints is used to indicate chunk(s) associated with a file. File system control 2208 passes chunk association information (e.g., representative data such as a fingerprint) to index 2224. Index 2224 is used to locate stored chunks in storage units 2210 via storage unit interface 2212. Duplicate eliminator 2206, also referred to as a segment store, identifies whether a newly received chunk has already been stored in storage units 2210. In the event that a chunk has already been stored in storage unit(s), a reference to the previously stored chunk is stored, for example, in a chunk tree associated with the file, instead of storing the newly received chunk. A chunk tree of a file may include one or more nodes and each node represents or references one of the deduplicated chunks stored in storage units 2210 that make up the file. Chunks are then packed by a container manager (which may be implemented as part of storage unit interface 2212) into one or more storage containers stored in storage units 2210. The deduplicated chunks may be further compressed into one or more CRs using a variation of compression algorithms, such as a Lempel-Ziv algorithm before being stored. A container may contain one or more CRs and each CR may contain one or more deduplicated chunks (also referred to deduplicated segments). A container may further contain the metadata such as fingerprints, sketches, type of the data chunks, etc. that are associated with the data chunks stored therein.

When a file is to be retrieved, file service interface 2202 is configured to communicate with file system control 2208 to identify appropriate chunks stored in storage units 2210 via storage unit interface 2212. Storage unit interface 2212 may be implemented as part of a container manager. File system control 2208 communicates (e.g., via segmenter 2204) with index 2224 to locate appropriate chunks stored in storage units via storage unit interface 2212. Appropriate chunks are retrieved from the associated containers via the container manager and are used to construct the requested file. The file is provided via interface 2202 in response to the request. In one embodiment, file system control 2208 utilizes a tree (e.g., a chunk tree obtained from namespace 2220) of content-based identifiers (e.g., fingerprints) to associate a file with data chunks and their locations in storage unit(s). In the event that a chunk associated with a given file or file changes, the content-based identifiers will change and the changes will ripple from the bottom to the top of the tree associated with the file efficiently since the appropriate content-based identifiers are easily identified using the tree structure. Note that some or all of the components as shown as part of deduplication engine 2201 may be implemented in software (e.g., executable code executed in a memory by a processor), hardware (e.g., processor(s)), or a combination thereof. For example, deduplication engine 2201 may be implemented in a form of executable instructions that can be stored in a machine-readable storage medium, where the instructions can be executed in a memory by a processor.

In one embodiment, storage system 2200 may be used as a tier of storage in a storage hierarchy that comprises other tiers of storage. One or more tiers of storage in this hierarchy may utilize different kinds of storage devices and/or may be optimized for different characteristics such as random update performance. Files are periodically moved among the tiers based on data management policies to achieve a cost-effective match to the current storage requirements of the files. For example, a file may initially be stored in a tier of storage that offers high performance for reads and writes. As the file ages, it may be moved into a tier of storage according to one embodiment of the invention. In various embodiments, tiers include different storage technologies (e.g., tape, hard drives, semiconductor-based memories, optical drives, etc.), different locations (e.g., local computer storage, local network storage, remote network storage, distributed storage, cloud storage, archive storage, vault storage, etc.), or any other appropriate storage for a tiered data storage system.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the invention also relate to an apparatus for performing the operations herein. Such a computer program is stored in a non-transitory computer readable medium. A machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments of the present invention are not described with reference to any particular programming language. It will be appreciated that a variety of programming languages may be used to implement the teachings of embodiments of the invention as described herein.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A computer-implemented method for caching content in a cache memory device, the method comprising:
    receiving, at a cache manager, one or more data chunks to be cached in a cache memory device, wherein the one or more data chunks are retrieved from a persistent storage disk of a storage system in response to a read request of a region of a file;
    compressing the one or more data chunks into a file extent using a predetermined compression algorithm;
    packing the file extent into a write-evict unit (WEU) maintained in a random-access memory (RAM) that has been open to store a plurality of file extents, wherein a size of a WEU is determined based on characteristics of the cache memory device;
    in response to determining that the WEU is full, writing content of the WEU from the RAM into the cache memory device;
    maintaining a priority list of WEUs based on a priority of an application whose data is contained in the WEU and evicting a WEU with a lowest priority; and
    inserting in a fingerprint entry of a fingerprint index a fingerprint of the file extent, the fingerprint entry mapping the fingerprint of the file extent to a storage location that stores the WEU, wherein the fingerprint index is utilized to determine whether a particular file extent has been stored in the cache memory device.

2. The method of claim 1, wherein the cache memory device is separated from the RAM and the cache memory device has a limited number of erasures during a lifespan of the cache memory device, and wherein a size of WEU is determined based on a size of an erasure unit associated with the cache memory device to improve the lifespan of the cache memory device.

3. The method of claim 1, wherein the storage system is a deduplicated storage system, and wherein at least one of the data chunks stored in the storage system is a deduplicated data chunk, and wherein a file extent includes one or more data chunks.

4. The method of claim 1, wherein data stored in the cache memory device is accessed on an extent basis.

5. The method of claim 1, wherein data is inserted and evicted from the cache memory device on a WEU basis.

6. The method of claim 1, wherein a size of a WEU is determined based on characteristics of the cache memory device.

7. The method of claim 6, further comprising:
maintaining access time and patterns for each of a plurality of WEUs stored in the cache memory device; and
evicting content of one of the WEUs from the cache memory device based on the access time and patterns of the WEUs, including selecting at least one of least recently used WEU and least frequently used WEU.

8. The method of claim 1, further comprising inserting an extent entry into a file index, the extent entry mapping the region and the file to a storage location that stores the WEU, wherein the file index is utilized to access the WEUs stored in the cache memory device.

9. A computer-implemented method for caching content in a cache memory device, the method comprising:
receiving, at a cache manager, one or more data chunks to be cached in a cache memory device, wherein the one or more data chunks are retrieved from a persistent storage disk of a storage system in response to a read request of a region of a file;
compressing the one or more data chunks into a file extent using a predetermined compression algorithm;
packing the file extent into a write-evict unit (WEU) maintained in a random-access memory (RAM) that has been open to store a plurality of file extents;
in response to determining that the WEU is full, writing content of the WEU from the RAM into the cache memory device; and
inserting an extent entry into a file index, the extent entry mapping the region and the file to a storage location that stores the WEU, wherein the file index is utilized to access the WEUs stored in the cache memory device, wherein each WEU includes a WEU header that contains fingerprints of the file extents included therein and information identifying the region and the file, and wherein in response to a crash of the storage system, the file index is reconstructed based on information retrieved from WEU headers of the WEUs stored in the cache memory device.

10. A storage system, comprising:
a processor;
one or more storage units to store a plurality of files;
a cache memory device to cache at least some data blocks of at least some of the files;
a file manager executed by the processor to provide an interface to access the plurality of files stored in the one or more storage units;
a random-access-memory coupled to the processor; and
a cache manager executed by the processor configured to
receive one or more data chunks to be cached in the cache memory device, wherein the one or more data chunks are retrieved from the one or more storage units in response to a read request of a region of a file,
compress the one or more data chunks of a file extent using a predetermined compression algorithm,
pack the file extent into a write-evict unit (WEU) maintained in the random-access memory (RAM) that has been open to store a plurality of file extents,
in response to determining that the WEU is full, write content of the WEU from the RAM into the cache memory device,
maintain a priority list of WEUs based on a priority of an application whose data is contained in the WEU and evicting a WEU with a lowest priority, and
insert in a fingerprint entry of a fingerprint index a fingerprint of the file extent, the fingerprint entry mapping the fingerprint of the file extent to a storage location that stores the WEU, wherein the fingerprint index is utilized to determine whether a particular file extent has been stored in the cache memory device.

11. The storage system of claim 10, wherein the storage system is a deduplicated storage system, and wherein at least one of the data chunks stored in the storage system is a deduplicated data chunk, and wherein a file extent includes one or more data chunks.

12. The storage system of claim 10, wherein data stored in the cache memory device is accessed on an extent basis.

13. The storage system of claim 10, wherein data is inserted and evicted from the cache memory device on a WEU basis.

14. The storage system of claim 10, wherein a size of a WEU is determined based on characteristics of the cache memory device.

15. The storage system of claim 10, wherein the cache memory device is separated from the RAM and the cache memory device has a limited number of erasures during a lifespan of the cache memory device, and wherein a size of WEU is determined based on a size of an erasure unit associated with the cache memory device to improve the lifespan of the cache memory device.

16. The storage system of claim 15, wherein the cache manager is further configured to:
maintain access time and patterns for each of a plurality of WEUs stored in the cache memory device, and
evict content of one of the WEUs from the cache memory device based on the access time and patterns of the WEUs, including selecting at least one of least recently used WEU and least frequently used WEU.

17. A non-transitory computer-readable storage medium having instructions stored therein, which when executed by a processor, cause the processor to perform operations for caching content in a cache memory device, the operations comprising:
receiving, at a cache manager, one or more data chunks to be cached in a cache memory device, wherein the one or more data chunks are retrieved from a persistent storage disk of a storage system in response to a read request of a region of a file;
compressing the one or more data chunks of a file extent using a predetermined compression algorithm;
packing the file extent into a write-evict unit (WEU) maintained in a random-access memory (RAM) that has been open to store a plurality of file extents;
in response to determining that the WEU is full, writing the WEU from the RAM into the cache memory device;

maintaining a priority list of WEUs based on a priority of an application whose data is contained in the WEU and evicting a WEU with a lowest priority; and inserting in a fingerprint entry of a fingerprint index a fingerprint of the file extent, the fingerprint entry mapping the fingerprint of the file extent to a storage location that stores the WEU, wherein the fingerprint index is utilized to determine whether a particular file extent has been stored in the cache memory device.

18. The non-transitory computer-readable storage medium of claim 17, wherein the storage system is a deduplicated storage system, and wherein at least one of the data chunks stored in the storage system is a deduplicated data chunk, and wherein a file extent includes one or more data chunks.

19. The non-transitory computer-readable storage medium of claim 17, wherein data stored in the cache memory device is accessed based on an extent basis.

20. The non-transitory computer-readable storage medium of claim 17, wherein data is inserted and evicted from the cache memory device on a WEU basis.

21. The non-transitory computer-readable storage medium of claim 17, wherein a size of a WEU is determined based on characteristics of the cache memory device.

22. The non-transitory computer-readable storage medium of claim 17, wherein the cache memory device is separated from the RAM and the cache memory device has a limited number of erasures during a lifespan of the cache memory device, and wherein a size of WEU is determined based on a size of an erasure unit associated with the cache memory device to improve the lifespan of the cache memory device.

23. The non-transitory computer-readable storage medium of claim 21, wherein the operations further comprise:
maintaining access time and patterns for each of a plurality of WEUs stored in the cache memory device; and
evicting content of one of the WEUs from the cache memory device based on the access time and patterns of the WEUs, including selecting at least one of least recently used WEU and least frequently used WEU.

24. The non-transitory computer-readable storage medium of claim 17, wherein the operations further comprise inserting an extent entry into a file index, the extent entry mapping the region and the file to a storage location that stores the WEU, wherein the file index is utilized to access the WEUs stored in the cache memory device.

25. A non-transitory computer-readable storage medium having instructions stored therein, which when executed by a processor, cause the processor to perform operations for caching content in a cache memory device, the operations comprising:
receiving, at a cache manager, one or more data chunks to be cached in a cache memory device, wherein the one or more data chunks are retrieved from a persistent storage disk of a storage system in response to a read request of a region of a file;
compressing the one or more data chunks into a file extent using a predetermined compression algorithm;
packing the file extent into a write-evict unit (WEU) maintained in a random-access memory (RAM) that has been open to store a plurality of file extents;
in response to determining that the WEU is full, writing content of the WEU from the RAM into the cache memory device; and
inserting an extent entry into a file index, the extent entry mapping the region and the file to a storage location that stores the WEU, wherein the file index is utilized to access the WEUs stored in the cache memory device, wherein each WEU includes a WEU header that contains fingerprints of the file extents included therein and information identifying the region and the file, and wherein in response to a crash of the storage system, the file index is reconstructed based on information retrieved from WEU headers of the WEUs stored in the cache memory device.

26. A storage system, comprising:
a processor;
one or more storage units to store a plurality of files;
a cache memory device to cache at least some data blocks of at least some of the files;
a file manager executed by the processor to provide an interface to access the plurality of files stored in the one or more storage units;
a random-access-memory coupled to the processor; and
a cache manager executed by the processor configured to
receive one or more data chunks to be cached in a cache memory device, wherein the one or more data chunks are retrieved from a persistent storage disk of a storage system in response to a read request of a region of a file,
compress the one or more data chunks into a file extent using a predetermined compression algorithm,
pack the file extent into a write-evict unit (WEU) maintained in a random-access memory (RAM) that has been open to store a plurality of file extents,
in response to determining that the WEU is full, writing content of the WEU from the RAM into the cache memory device, and
insert an extent entry into a file index, the extent entry mapping the region and the file to a storage location that stores the WEU, wherein the file index is utilized to access the WEUs stored in the cache memory device, wherein each WEU includes a WEU header that contains fingerprints of the file extents included therein and information identifying the region and the file, and wherein in response to a crash of the storage system, the file index is reconstructed based on information retrieved from WEU headers of the WEUs stored in the cache memory device.

* * * * *